United States Patent [19]

Stark et al.

[11] 4,191,594
[45] Mar. 4, 1980

[54] SOLAR ENERGY CONVERSION

[75] Inventors: Virgil Stark, 936 Fifth Ave., New York, N.Y. 10021; Alexandre Vayda, Lausanne, Switzerland; Paul Rousset, Cannes, France

[73] Assignee: Virgil Stark, New York, N.Y.

[21] Appl. No.: 866,068

[22] Filed: Dec. 30, 1977

Related U.S. Application Data

[62] Division of Ser. No. 746,065, Nov. 30, 1976, Pat. No. 4,134,393.

[30] Foreign Application Priority Data

Jul. 9, 1976 [FR] France .................. 76 20986
Oct. 8, 1976 [FR] France .................. 76 30248

[51] Int. Cl.² ................................. H01L 31/04
[52] U.S. Cl. ........................ 136/89 PC; 136/89 HY
[58] Field of Search ............ 136/89 PC, 89 HY; 126/270, 271

[56] References Cited

U.S. PATENT DOCUMENTS

| | | | |
|---|---|---|---|
| 3,018,313 | 1/1962 | Gattone | 136/89 |
| 3,990,914 | 11/1976 | Weinstein et al. | 136/89 |
| 4,003,756 | 1/1977 | Abrams | 136/89 PC |
| 4,029,519 | 6/1977 | Schertz et al. | 136/89 PC |
| 4,045,246 | 8/1977 | Mlavsky et al. | 136/89 PC |
| 4,081,289 | 3/1978 | Campbell | 136/89 PC |

FOREIGN PATENT DOCUMENTS 1089018  9/1960  Fed. Rep. of Germany ...... 136/89 PC

OTHER PUBLICATIONS

D. G. Scheuler et al. "Integration of Photovoltaic & Solar-Thermal Energy Conversion Systems", *Conf. Record, 11th IEEE Photovoltaic Specialists' Conf.*, May 1975, pp 327-331.

*Primary Examiner*—Aaron Weisstuch
*Attorney, Agent, or Firm*—Kenyon & Kenyon

[57] ABSTRACT

Apparatus and methods for concentrating and collecting solar energy are disclosed. In accordance with the invention, solar energy is concentrated by economical refringent lenses or lens systems including fluid lenses and/or Fresnel-type lenses. The lenses concentrate the solar energy preferably along lines in continuous linear foci or in discrete foci at an elongated collector comprising one or more fluid-carrying conduits and one or more fluids therein. In one embodiment, a plurality of photoelectric cells are located in or on the collector along the linear foci or at the discrete foci and operate at increased efficiency with heat being removed by the collector. A first fluid in the collector is heated by the concentrated solar energy and in a preferred embodiment is used to heat a second fluid contiguous to the first fluid, the first fluid having a boiling point exceeding that of the second fluid. In a preferred embodiment, the first fluid is carried in an inner conduit while the second fluid is carried by an outer conduit which encloses the inner conduit and first fluid. Thus, the two fluids can be heated to different temperatures by a single concentrating system and used for different purposes.

14 Claims, 31 Drawing Figures

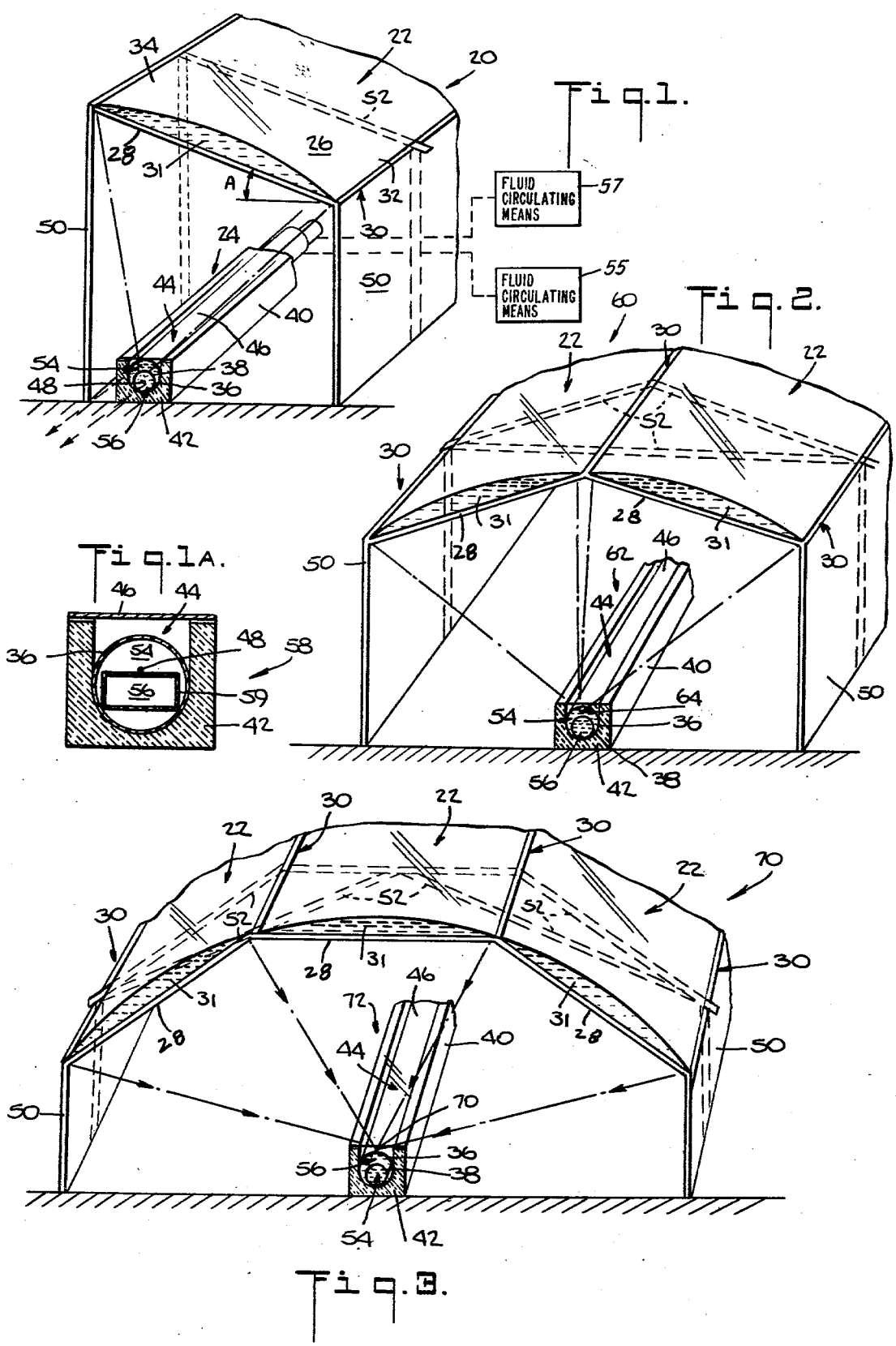

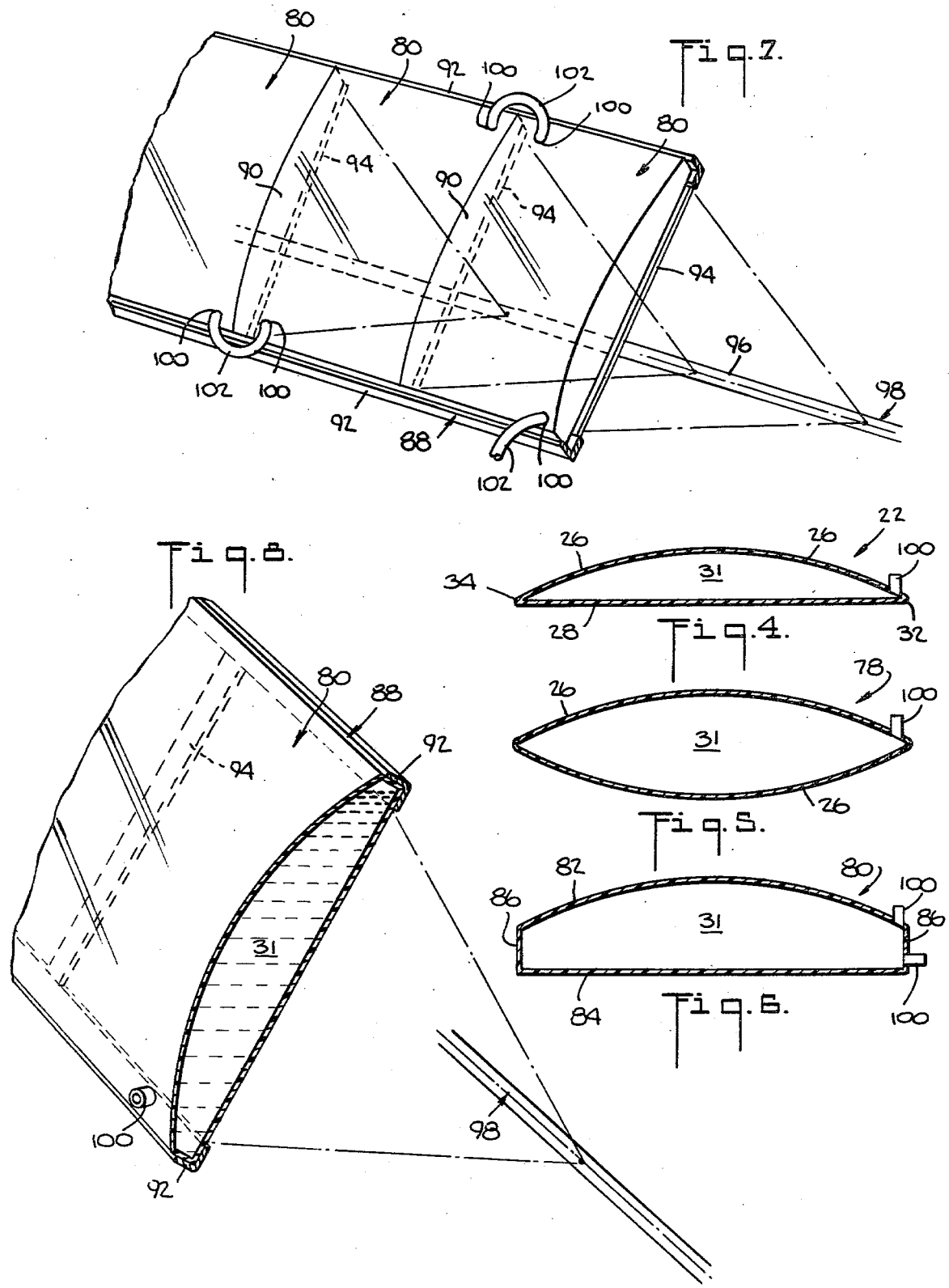

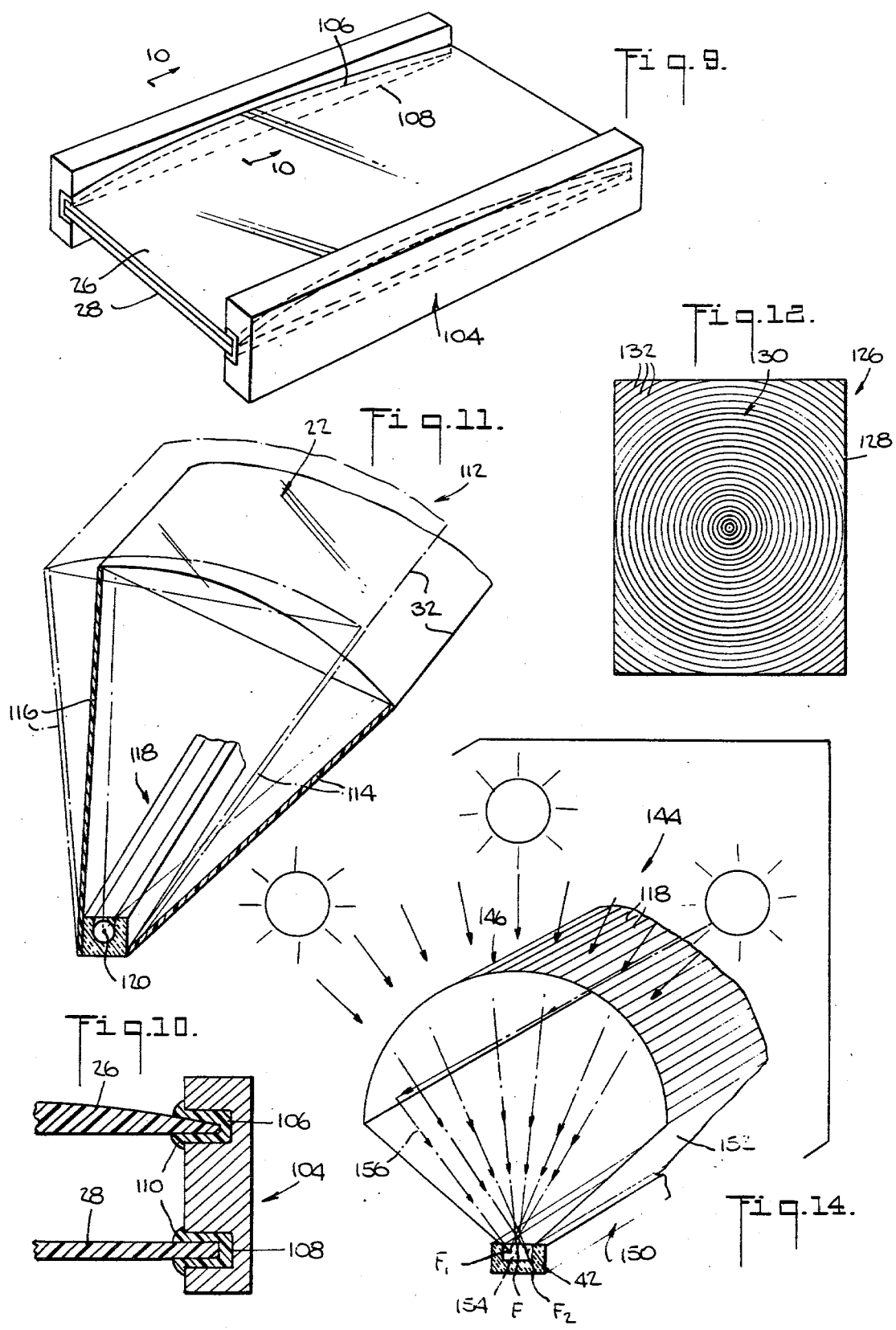

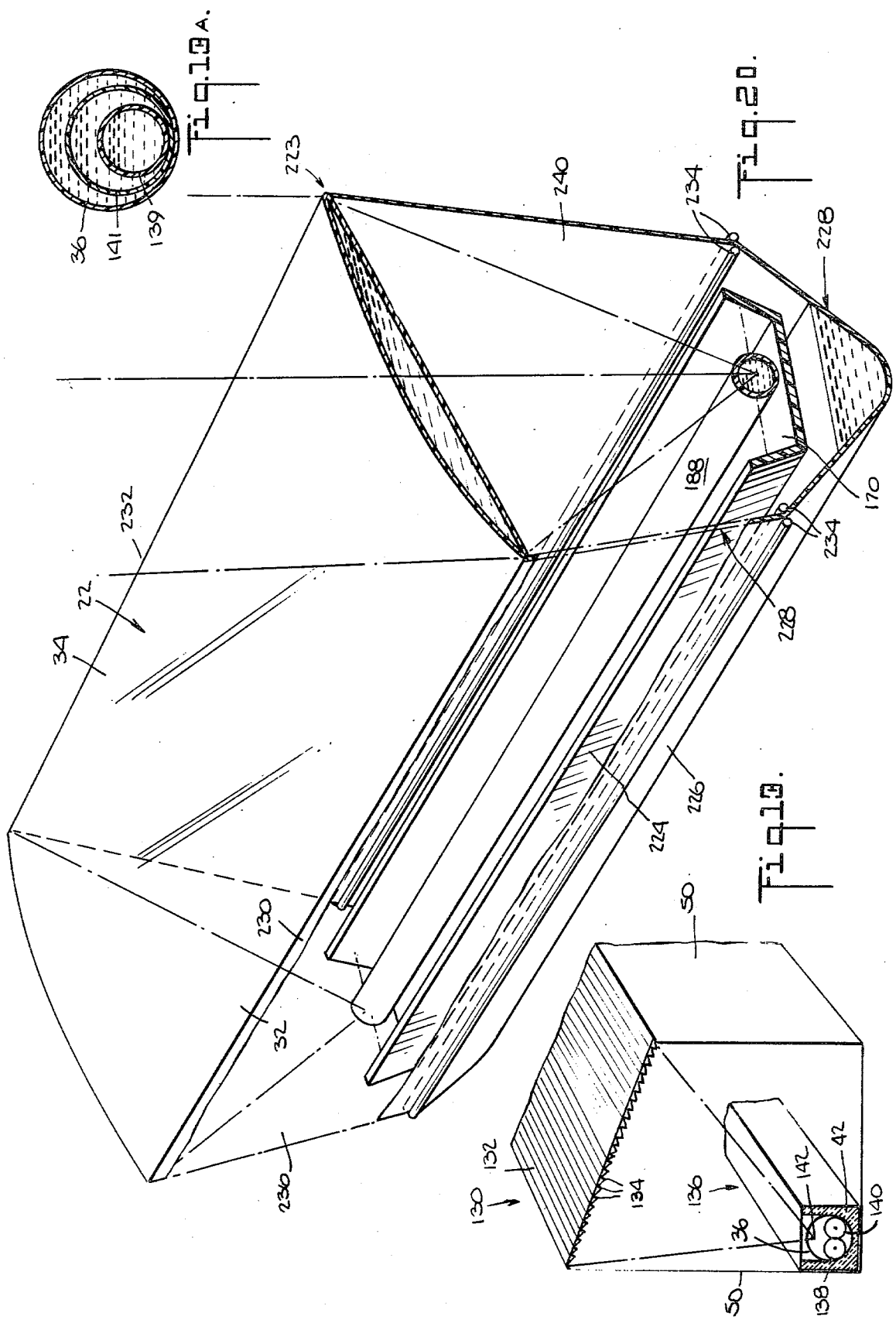

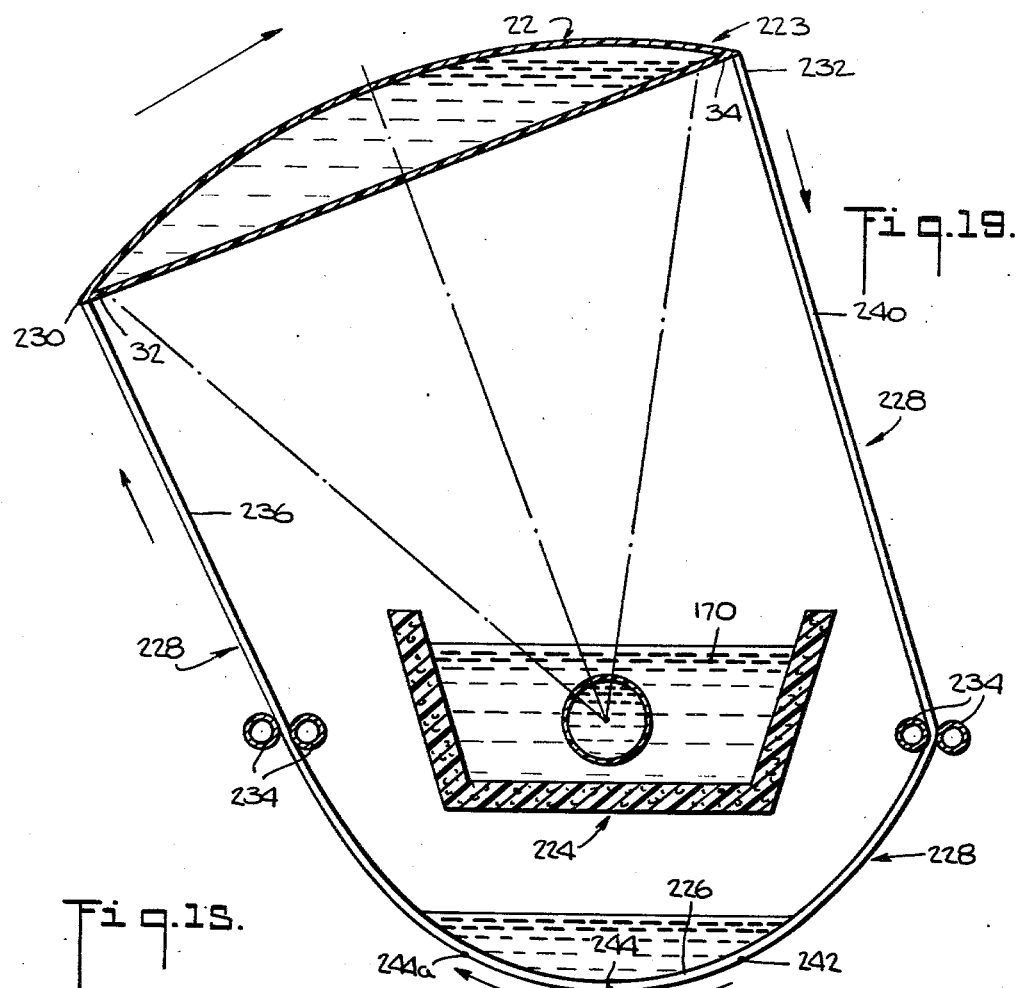
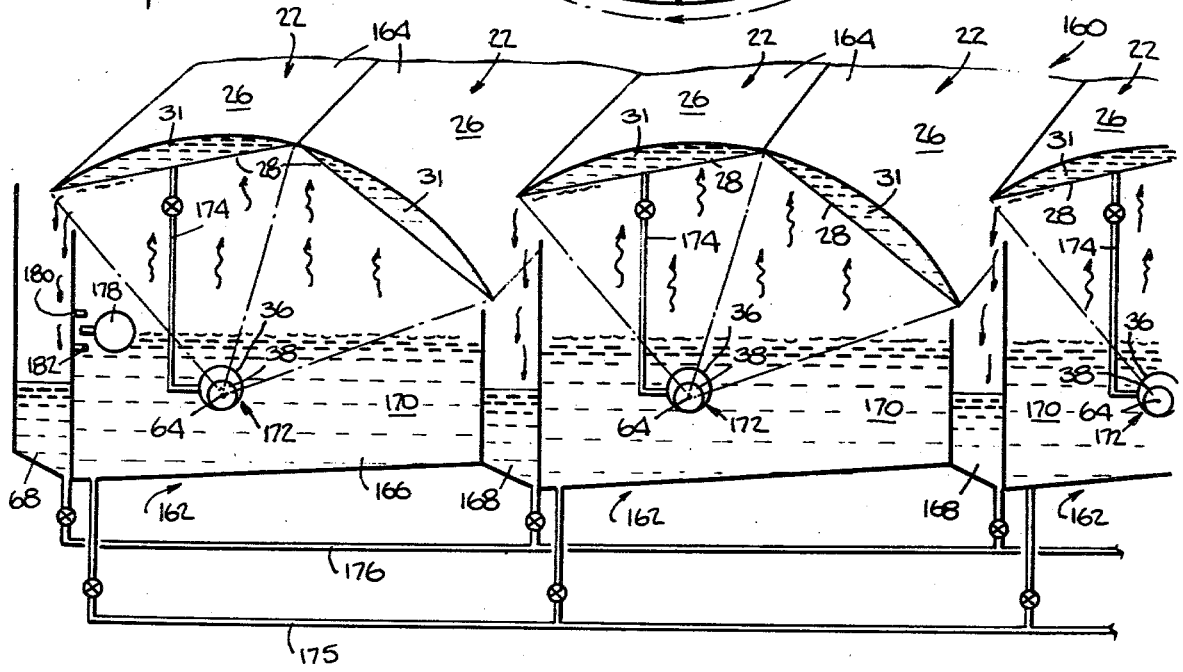

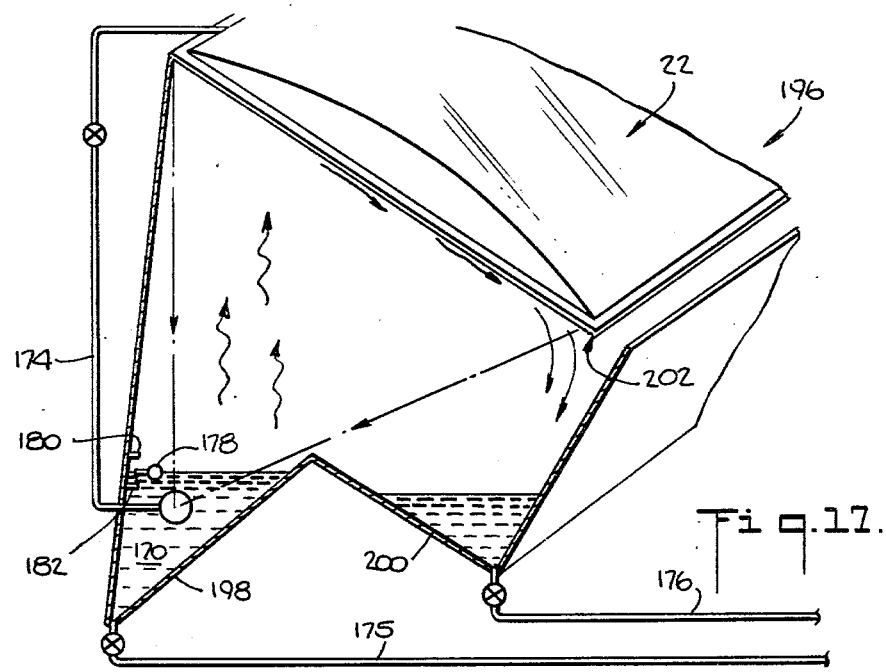
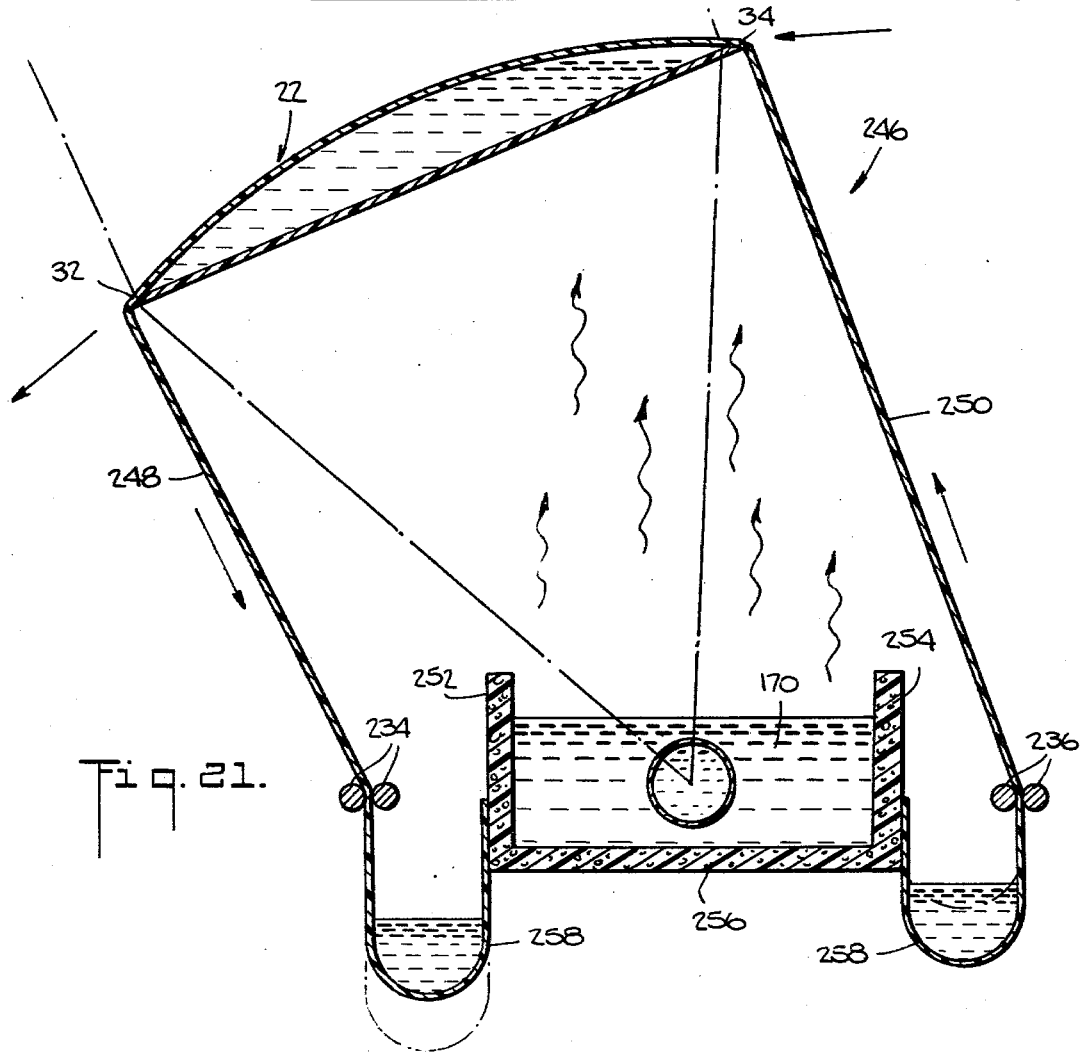

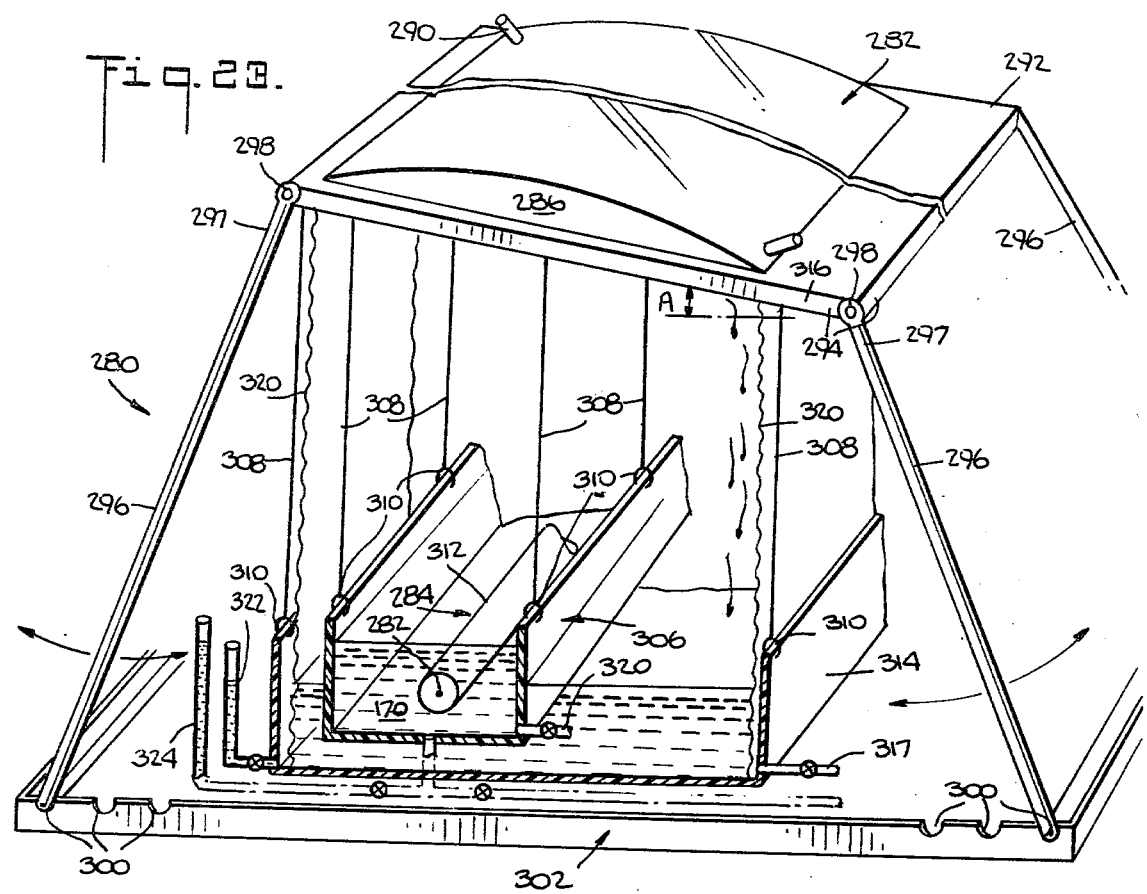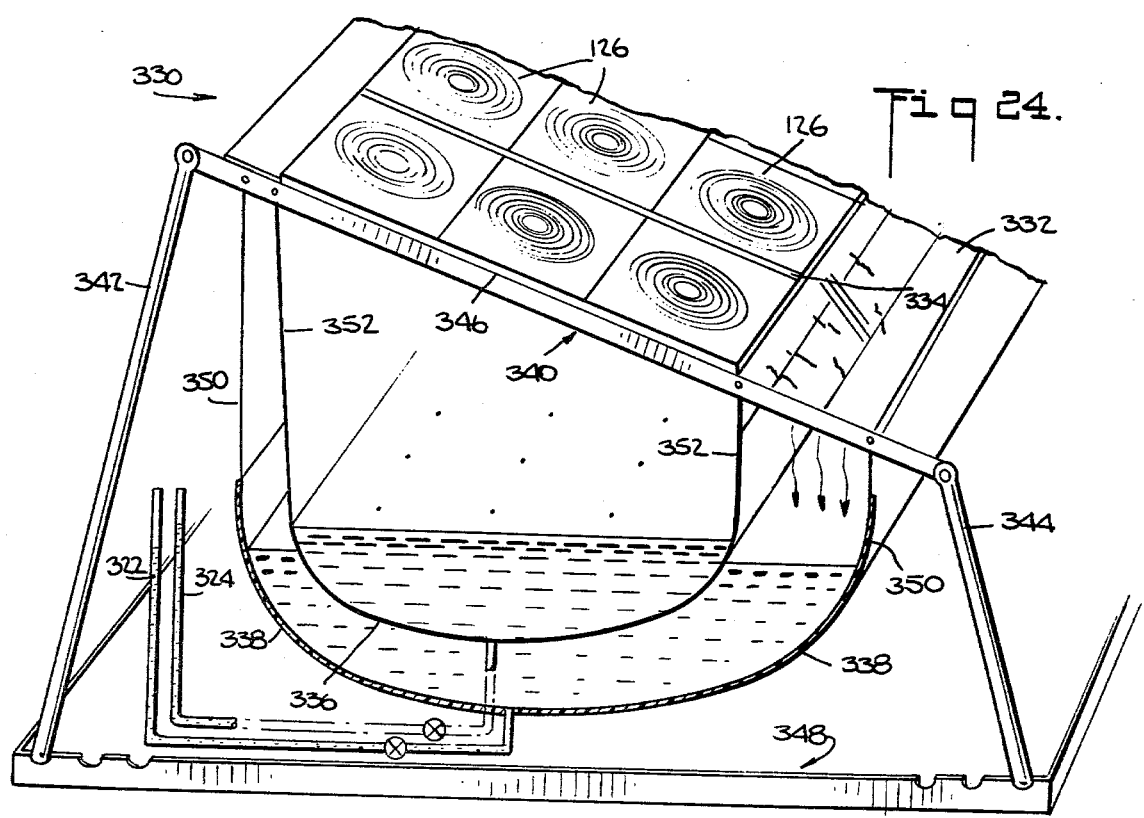

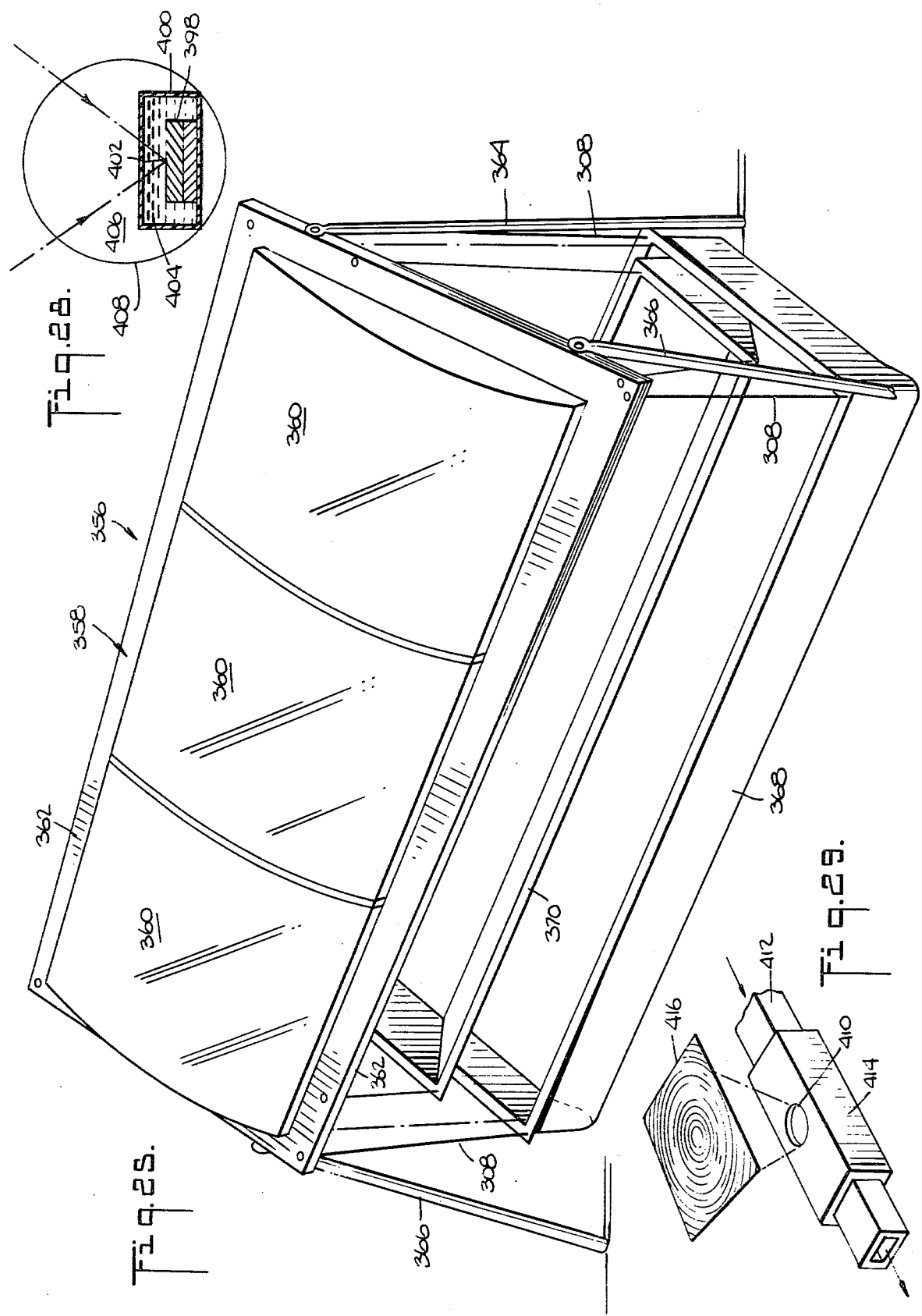

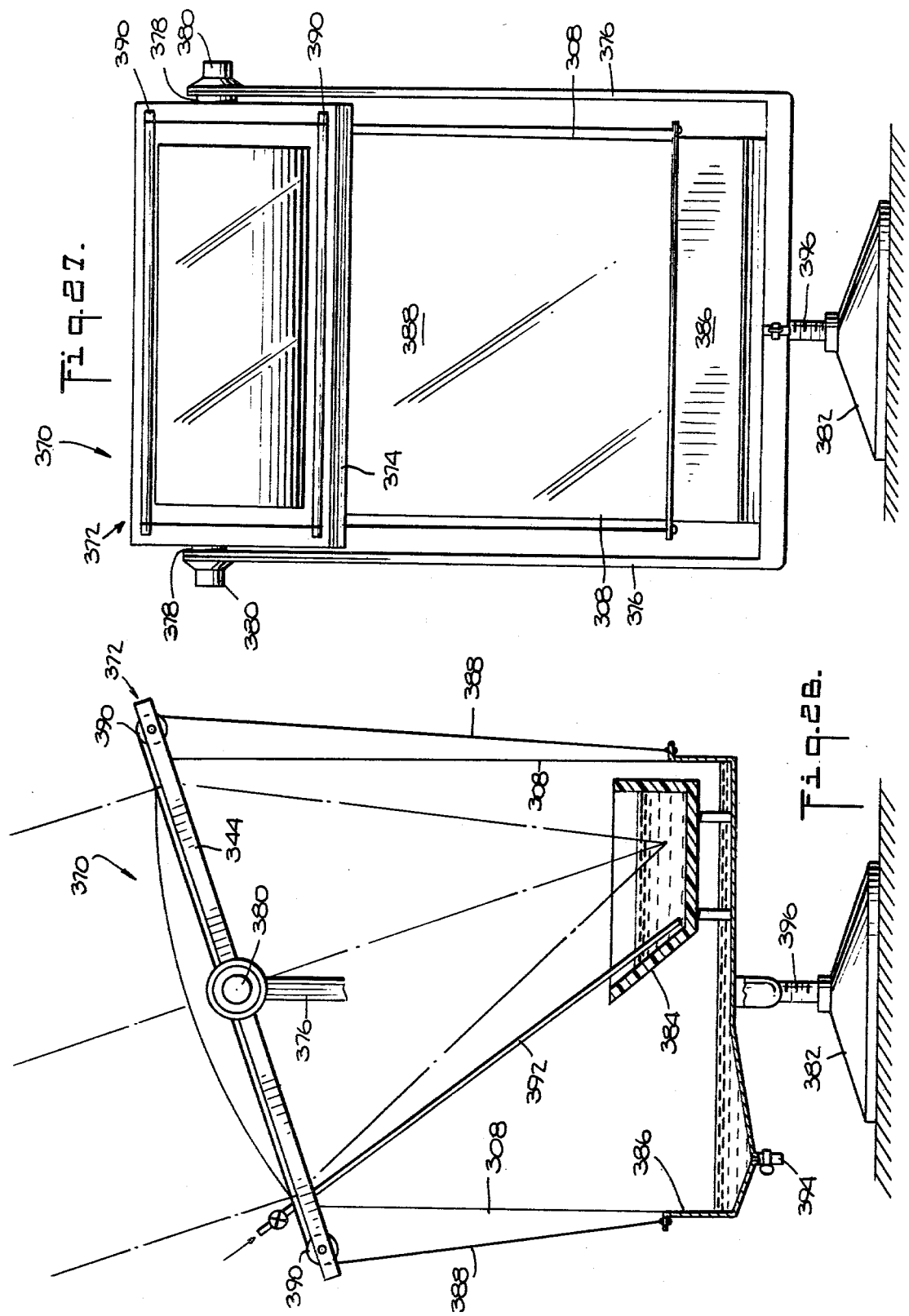

SOLAR ENERGY CONVERSION

This is a division, of application Ser. No. 746,065, filed Nov. 30, 1976, now U.S. Pat. No. 4,134,393.

BACKGROUND OF THE INVENTION

1. Field of the Invention

The present invention relates to methods and apparatus for concentrating and collecting solar energy for many uses including the conversion thereof to heat energy and/or electrical energy to be used for many purposes. The present invention also relates to the storage and use of heat energy during hours without sun or with reduced sun. The present invention further relates to the treatment of water containing salt and/or other substances using fixed and portable apparatus and methods according to the invention. More particularly, the invention relates to methods and apparatus using fluid and/or Fresnel concentrating lenses and lens systems and elongated collectors comprising at least one fluid-carrying conduit located at the foci of the lenses.

2. Description of the Prior Art

The energy emitted by the sun corresponds to a high temperature in the order of 6000° C., and is emitted in the form of radiation which arrives at the earth with a wavelength distribution comprising about 3% ultraviolet rays, 42% visible light rays, and about 55% infrared rays. It is well known that surfaces exposed to the sun collect at least to some degree the solar radiation and that the absorption of this radiation results in a heating of the material constituting the surface. It is also known that electricity can be produced by photoelectric devices exposed to the sun's rays.

There have been many attempts in the past to collect and utilize pollution-free and essentially nonconsumable solar energy to meet many energy needs. Much attention has been directed to the conversion and utilization of solar energy in the past few years because of the realization that fossil fuels are exhaustable and that a burning of these fuels produces pollution. Solar energy, on the other hand, is inexhaustible and available above the clouds at an average energy level of approximately 1350 watts per horizontal square meter. A percentage of this energy, depending on atmospheric and weather conditions, dust, pollution, etc., is available at the surface of the earth during periods of sunshine which vary up to about 4000 hours per year depending on location. Even more recently, the shortage of fossil fuels particularly oil and the high cost thereof have sparked new attempts to harness the energy of the sun. As in the past, however, fuels are still a lesser expensive source of energy and the same problems of high capital cost and the cyclic nature of the sun requiring storage capability have still not been satisfactorily solved. For example, refringent lens focusing systems, most using reflecting collectors and most including sun-tracking systems, have heretofore been used but are uneconomical and impractical because of the high cost involved. A conventional way for obtaining lower temperatures up to about 80° C. consists of using dark-colored panels which absorb the solar radiation, and combining these panels with means circulating a heat-carrying fluid in a heat-exchanging manner with the panels. It is also known to improve the efficiency of these systems by placing one or more glass plates above the panels to produce a greenhouse effect for reducing heat losses. However, the efficiency of these panel systems is low, from about 30% to about 60%, and they require large spaces resulting in large heat losses, and they also require a high capital investment. The use of Fresneltype lenses and fluid lenses is known in the art for focusing solar energy. See, for example, U.S. Pat. Nos. 3,915,148; 3,125,091; 937,013; 3,965,683; 3,901,036; 60,109; 1,081,098; Japanese Pat. No. 28-2130, and Australian Pat. No. 131,069. However, none of the known systems is capable of converting and storing solar energy efficiently and none can produce heat at an economical capital investment such that the use of solar energy is competitive with other energies. The prior art also does not disclose obtaining temperatures in the order of a few hundred degrees C while also obtaining at the same time lower temperatures usable for home heating and water heating or other purposes. Nor is there in the prior art a system which is capable of storing heat energy from solar energy during periods of interrupted solar energy for any length of time and which also is capable of providing different temperatures simultaneously and also utilizing the luminous and infrared rays of the sun. With respect to electrical generation, it is known that concentrating the solar energy at a photoelectric cell will increase the electrical output of cell; however, there is the disadvantage that the increased heat in the photoelectric cell resulting from the concentration will also limit the cell output. Known photovoltaic devices produce a maximum of about one watt per hour per cell. Assuming a cost of $10 per photovoltaic cell, a system using non-concentrated solar energy to generate about 1 kilowatt per hour requires a capital cost of at least $10,000 which is not competitive for normal uses. With respect to solar stills, known stills used for distillation of seawater have low efficiencies and the cost of heating the water is high as the least amount of heat required to vaporize the water is not recovered from the condensation but rather is lost.

In accordance with the invention the prior art drawbacks and disadvantages are substantially overcome and additional advantages realized.

SUMMARY OF THE INVENTION

The present invention is embodied in and carried out by methods and apparatus for concentrating, collecting, storing and utilizing solar energy. In accordance with the invention, refringent lens means concentrate the solar energy along a length at elongated collector means containing at least one fluid therein. Further in accordance with the invention, the lens means comprise economical fluid or Fresnel-type lenses and lens systems which focus the solar energy substantially along the length at the collector means along substantially continuous lines or in lines of substantially discrete points. Thus, the at least one fluid in the elongated collector may be efficiently heated to high temperatures in the order of a few hundred degrees C. The fluid lenses are advantageously made from separate upper and lower solar energy transmitting plates which are installed in frame means in a fluid-tight manner, or the fluid lenses may be welded, extruded, or blown similar to glass or plastic bottles. The fluid within the lenses preferably has an index of refraction similar to that of lens plates. The enclosure in the lens containing the fluid is advantageously communicated with the collector means to enhance performance. Still further in accordance with the invention, the elongated collector means comprises a plurality of fluids, adjacent ones of which are contiguous. The fluids are preferably isolated and disposed in adjacent conduits and the fluids preferably differ and have varying boiling points. The theoretical focus or foci of the lens means are preferably on the surface of or within the higher or highest boiling point liquid. In a preferred embodiment, the elongated collector means comprises at least two conduits; one of the conduits containing a first fluid having a first boiling point is located within a second conduit containing a second fluid having a second boiling point. Preferably, the solar energy is concentrated at the inner liquid which has a boiling point which exceeds that of the outer liquid. The conduits and fluids are solar energy transmitting or opaque or darkened depending on the location of the lens means focus. By solar energy transmitting it is meant that the solar rays are substantially transmitted through the material as opposed to being absorbed and with respect to the luminous rays of the sun is synonymous with the word transparent. In this way, the fluid may be heated to different temperatures and accordingly can be utilized for different purposes, if desired. Regulation of the fluid flow rates and selection of conduit sizes and shapes assists in providing different temperatures which may be utilized for different purposes. Arrangement of multiple conduits carrying multiple fluids in accordance with the invention can provide energy for many different uses including a vapor and super-heated vapor for mechanical devices including turbines. Advantageously, the lower boiling point fluid has a low latent heat of vaporization and is useful for this purpose. Additionally, heat is stored in the higher boiling point fluid by permitting its temperature to rise during periods of solar energy to a temperature substantially higher than that of the lower boiling point fluid which may be used as a working fluid. Heat is removed from the higher boiling temperature fluid by, for example, circulating the lower boiling point fluid past the higher boiling point fluid. The invention also provides for the union of individual systems to form larger composite systems. Thus, a high degree of concentration of solar energy is possible. Still further in accordance with the invention, both the infrared and luminous rays of the sun may be simultaneously utilized. Photoelectric cells can be disposed at the collector means such that the luminous rays are concentrated thereat for maximum electrical energy production while the heat generated by the concentration of the infrared rays is removed by one or more fluids in the collector means whose flow rates and volumes may be regulated. Thus, in accordance with the invention, the solar energy is concentrated by a factor in the order of up to 50 to 100 so that one of the known cells is able to produce up to 50 to 100 watts per hour instead of 1 watt per hour during periods of sunshine. Further in accordance with the present invention, water may be distilled by locating the collector means in the water to be distilled, above which is positioned lens means and a downwardly sloping substantially smooth, preferably planar surface, whereby water is evaporated and condenses on the smooth surface which carries the condensed water to a collecting vessel positioned below the lower side thereof. Means are provided to completely enclose the apparatus while permitting movement of the lens or the entire system to track the sun seasonally or daily. It is preferred that the lens system for the water distilling apparatus comprise fluid lens means which include said smooth surface and in which the solar energy transmitting fluid forming part of the lens means is circulated within the collector means to advantageously utilize the latent heat released by the vapor condensing on said smooth surface and transferred to the water to be distilled. The heat released by the condensing water is thus not lost and returned to the system by means of the lens fluid and the circulation thereof, thereby increasing substantially the efficiency of the system and the quantity of heated water obtained from water to be distilled. Salt may be produced from the resulting concentrated brine and credit obtained from the sale thereof to lower the overall cost of obtaining distilled water. According to one embodiment of the invention, the still is portable and is easily assembled and disassembled. Advantageously, the stills are operative to distill seawater and brackish water and may be used at sea, for example, on life boats, and in desert areas.

The collecting surface area of the apparatus of the present invention is much smaller than the collecting surface area of flat panel systems and is from about 2% to about 10% of the surface area of flat panel systems for comparable energy collection. Lower collecting surface areas result in lower heat losses, higher efficiencies, lower cost for energy produced, and require lower investment cost. The apparatus may be enclosed according to the invention to further reduce heat losses and form enclosed systems. Since the temperature of the fluid can be raised to a relatively high value in the present invention, a variety of simultaneous uses are available including using a plurality of fluids of different boiling points for many different purposes. The higher temperatures attainable and the use of multiple fluids permit heat storage during non-solar energy periods. The higher temperatures permit the use of smaller storage tanks or other storage means. For example, for the same fluid, $2\frac{1}{2}$ times less space is required to store the same heat at 200° C. than at 80° C. The higher boiling point fluids and the heat storage capability obviate the need for antifreeze. According to the invention, diffuse solar energy representing up to about 40% of the solar energy received is concentrated at the collector means and thereby utilized which is not the case with reflecting concentrators. The efficiency of apparatus according to the invention is high and its cost is low in comparison to known systems and the cost of obtaining energy competitive with fuels. Moreover, the present invention has the advantage of generating electricity, producing heat simultaneously or separately and storing heat and is useful in many applications, thus increasing system efficiency, utilization and amortizing the cost of the system. Since reflective surfaces which do not reflect diffuse solar energy are not required to practice the present invention, the need to maintain reflective surfaces which weather easily and frequently require refurbishing is obviated. Also, as will be more apparent hereinafter, tracking equipment is not essential to practicing the present invention, particularly tracking equipment of the type which follows the sun on a daily basis as the system is located east-west. Apparatus according to the invention can advantageously be combined with a conventional heat pump producing and storing additional heat from the surrounding air or water. This may be particularly significant during winter months when lower sun energy is available and there is more consumption of energy for heating.

These and other aspects of the present invention will be more apparent from the following description of the preferred embodiments thereof when considered with the accompanying drawings.

BRIEF DESCRIPTION OF THE DRAWINGS

The present invention is illustrated by way of example and not limitation in the figures of the accompanying drawings in which like numerals refer to like parts and in which:

FIG. 1 is a schematic perspective diagram showing a system according to the invention comprising an elongated fluid lens and a collector comprising two fluid-carrying conduits, one enclosed in the other with the focus of the lens located within the inner conduit;

FIG. 1A is a cross-section view of another embodiment of the collector of FIG. 1 showing a rectangular inner conduit on the upper surface of which is located the focus of the lens of FIG. 1;

FIG. 2 is a schematic perspective diagram showing another system according to the invention similar to that of FIG. 1 comprising two radially juxtaposed, elongated fluid lenses in which the focus thereof is located within the outer conduit;

FIG. 3 is a schematic perspective diagram showing still another system to those of FIGS. 1 and 2 according to the invention comprising three radially juxtaposed, elongated fluid lenses in which the focus thereof is located on the upper surface of the outer conduit;

FIGS. 4–6 are cross-section views showing different configurations of fluid lenses according to the invention;

FIG. 7 is a perspective view showing a series of longitudinally juxtaposed fluid lenses and means for intercommunicating the enclosures of the respective lenses, this arrangement being utilizable to arrange a plurality of longitudinally juxtaposed lenses where single lens are now shown;

FIG. 8 is a detail perspective of FIG. 7 showing the lens frame;

FIG. 9 is a perspective view of a lens system according to the invention comprising two separate plates for enclosing a lens fluid and a frame for sealing the plates into a fluidtight lens;

FIG. 10 is a cross-section view of the lens and frame of FIG. 9 taken along line 10—10;

FIG. 11 is a schematic perspective diagram similar to that of FIG. 1 showing another system according to the invention in which the system is enclosed, the single lens is movable to follow the seasonal location of the sun and in which the collector comprises a single fluid-carrying conduit;

FIG. 12 is a plan view of a planar, point-focusing, Fresnel-type lens;

FIG. 13 is a schematic perspective diagram showing another system according to the invention comprising an elongated, planar Fresnel-type lens having a linear focus and a collector comprising three fluid-carrying conduits in which an outer conduit encloses two inner conduits and in which the focus of the lens is located within the outer conduit;

FIG. 13A is a cross-section view of part of another collector comprising three fluid-carrying conduits in which the innermost conduit is enclosed by the intermediate conduit which is enclosed by the outermost conduit;

FIG. 14 is a schematic perspective diagram showing yet another system according to the invention comprising an elongated curvilinear Fresnel-type lens and a collector comprising a single rectangular fluid-carrying conduit;

FIG. 15 is a schematic perspective diagram of a composite system according to the invention for distilling water comprising individual systems each comprising two elongated fluid lenses and a collector located in the water to be distilled comprising two fluid-carrying conduits, one enclosed in the other;

FIG. 17 is a schematic perspective diagram of another system according to the invention for distilling water comprising a single elongated fluid lens and a collector comprising a single fluid-carrying conduit;

FIG. 19 is a transverse cross-section view of another enclosed system according to the invention for distilling water also comprising a single, elongated, movable lens and a collector comprising a single fluid-carrying conduit;

FIG. 20 is a perspective view partly in cross-section of the system of FIG. 19;

FIG. 21 is a transverse cross-section view of another enclosed system according to the invention for distilling water also comprising a single, elongated, movable lens and a collector comprising a single fluid-carrying conduit, and having two sliding side panels which form bags for collecting the condensate;

FIG. 23 is a schematic perspective diagram of a portable, easily assembled and disassembled system having a fluid lens for distilling water according to the invention;

FIG. 24 is a schematic perspective diagram of another portable easily assembled and disassembled system having Fresnel lenses for distilling water according to the invention;

FIG. 25 is a schematic perspective diagram of still another portable system having fluid lenses for distilling water according to the invention;

FIGS. 26 and 27 are plan side and front views, respectively, of another system for distilling water according to the invention showing means for adjusting the inclination of the fluid lens and for adjusting the horizontal orientation of the entire system.

FIG. 28 is a cross-section view of a photoelectric cell positioned in a fluid-carrying conduit to produce electricity from solar energy according to the invention with fluid circulating inside and/or outside the conduit to remove heat; and FIG. 29 is a perspective view of a collector according to the invention comprising apertures for collecting solar energy from point focus lenses.

DESCRIPTION OF THE PREFERRED EMBODIMENTS

Figure 16:
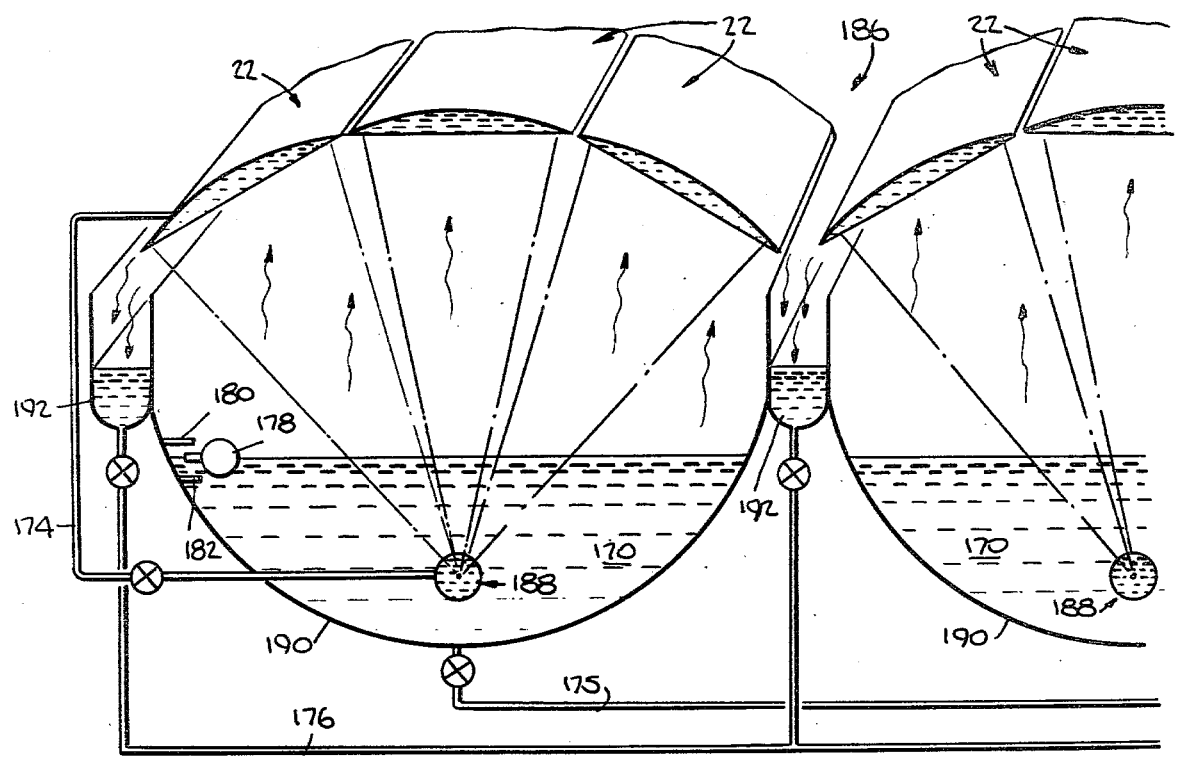
FIG. 16 is a schematic perspective diagram of another composite system according to the invention for distilling water similar to that of FIG. 15 in which the collector comprises a single fluid-carrying conduit and lenses concentrating the solar energy in a single linear focus.

In FIGS. 1–3 are shown solar energy collecting systems according to the invention comprising refringent fluid lens concentrators and fluid-containing solar energy collectors. Referring to FIG. 1, system 20 is shown comprising an elongated fluid lens concentrator 22 and collector 24 in the form of elongated fluid-containing conduits. Elongated fluid lens 22 comprises solar energy transmitting plates 26, 28 mounted in frame 30 and spaced to enclose solar energy transmitting fluid 31. In the embodiment shown in FIG. 1, upper lens plate 26 is convex and lower plate 28 is planar. The respective sides 32, 34 of lens plates 26, 28 and the ends of the lens plates (not shown in FIG. 1) are sealed to be fluid-tight in manners which will be described hereinafter. Alternatively, means not shown in FIG. 1 for adding and removing or circulating fluid 31 and air are provided in the sides and/or ends of the lens plates. Additionally, means also not shown in FIG. 1 for longitudinally and transversely (radially) juxtaposing lenses may be provided and will also be described hereinafter. In the embodiment shown in FIG. 1, collector 24 comprises an outer elongated conduit 36 enclosing an inner elongated conduit 38, both shown to be tubular in shape. Conduit 36 is placed in insulating container 40 and is surrounded by insulating material 42 except for a longitudinally extending opening 44 located above conduit 36. Opening 44 is closed off by solar energy transmitting and heat insulating plate 46. Plate 46 is suitably made of glass or plastic and the insulating material 42 is suitably a foam such as polyethylene foam. Collector 24 is located below lens 22 and the theoretical linear focus 48 is located at or along the collector for substantially all of the daylight hours. The space between the lens and collector is enclosed by side panels 50 which if rigid can also serve to support lens 22 and frame 30 in cooperation with support member 52. For optimum concentration of solar energy at collector 24, lens 22 is oriented at a preselected angle A with the horizontal, the longitudinal axis of the lens (and of the system) is oriented along the east-west direction and the convex upper lens plate 26 is oriented to face south (northern hemisphere). The optimum value for angle A depends upon the location of the system 20, and for a fixed system is chosen to give optimum concentration on a seasonal basis. For movable systems, which will be described hereinafter, angle A is selected for optimum seasonal solar energy concentration or for optimum concentration for even shorter periods of time.

As mentioned hereinbefore, the collector 24 is located at the theoretical focus 48 of the lens 22 and in the embodiment of FIG. 1, conduits 36 and 38 are solar energy transmitting, the theoretical focus 48 being located within the inner conduit 38. Conduits 36 and 38 contain heat-carrying fluids 54 and 56, respectively. Since the concentration of the solar energy will be greatest in the fluid within the conduit at which the lens theoretical focus is located, i.e., in fluid 56 within conduit 38, fluid 56 may be heated to a relatively high temperature and is therefore chosen to have a relatively high boiling point, for example,, from about 150° C. to about 350° C. Such fluids may comprise by way of example and not limitation lubricating oils, glycerine, olive oil, paraffin oils, etc. Thus, during periods of sunshine, fluid 56 is heated to a temperature which may be in excess of 100° C., for example, 200° C., the precise temperature attained depending on many factors such as the flow rate of fluids 54, 56, the diameters of conduits 36, 38 sun intensity and position, insulation, heat exchange rates, etc. Fluid circulating means 55, 57 are provided to control the circulation of fluids 54, 56 through conduits 36, 38, respectively. Fluid 54 is selected to have a boiling point which is less than the boiling point of fluid 56, preferably at least 50° C. less than the boiling point of fluid 56, and preferably in the temperature range of from about −62° C. to about 100° C. Such a fluid is suitably water. It is also preferred that fluid 54 have a low latent heat of vaporization, for example, from about 20 calories per kilogram to about 270 calories per kilogram, and such fluids may comprise by way of example and not limitation freon, butane, propane, ammonia, ethyl ether, methyl alcohol, etc.

In operation, solar energy is concentrated in fluid 56 (lubricating oil) within conduit 38 and raises the temperature of the oil to about 200° C. Since the focus to lens 22 is theoretically linear, fluid 56 will be continually heated as it traverses the linear focus. Fluid 54 (water) which surrounds the oil and conduit 38 is heated primarily by the oil primarily through conduction. Both fluids, oil and water, are circulated by fluid circulating means 55, 57 at predetermined rates to obtain desired temperatures and may be used for different heat applications. For example, the water may be heated to about 70° C.–80° C. or more and used for space and hot water heating. The water may be heated to lower temperatures and used, for example, in swimming pools. The higher temperature oil may be used for applications requiring higher temperatures including industrial applications or may be used merely to heat the water. Since the temperature of fluid 56 increases as it traverses the lens focus, fluids at many different temperatures are realizable by providing taps for fluid outlet and/or inlet at different points along the focus. Fluid 54 may be evaporated and the vapor or superheated vapor used to produce mechanical power in a turbine or engine which, in turn, may generate electricity. Preferably, a closed system (not shown) is employed in which the condensed fluid is returned to collector 24. In such applications, fluids such as freon, butane, propane, ethyl ether, methyl alcohol, ammonia and the like may constitute fluid 54.

As mentioned hereinbefore, a serious drawback of solar energy systems in general and known systems in particular relates to the sotrage of energy during periods in which there is no sunshine or the intensity thereof is low, as for example during the night or during periods of cloudy weather. In accordance with the present invention, heat is stored for use in those periods in fluid 56 which is heated during normal system operation to a temperature which is at least about 50° C. higher than the temperature of fluid 54. Therefore, even when fluid 56 is not being heated by solar energy or being heated at a reduced rate, it stores heat and will continue to supply heat to fluid 54 due to the temperature difference between the two fluids. Preferably, the circulation of fluid 56 is stopped by fluid circulating means 57 for those periods. Fluid 56 continues to transfer heat to fluid 54 until the difference in the temperature of the two fluids is relatively small. The time that fluid 56 will transfer and/or store heat depends upon the initial temperature of fluid 56, the difference in temperatures between the fluids, the volumes of the fluid, the characteristics (specific heat, boiling point, latent heat, etc.) of the fluids, the use to which fluid 54 is put, etc.

Further in accordance with the invention, the fluid 31 in lens 22 may be communicated (not shown) with collector 24 through conduit 36 or 38 or through another separate conduit to remove heat from the lens fluid, thereby maintaining it at a suitable temperature while utilizing solar energy absorbed by the lens fluid.

In FIG. 1, collector 24 was shown to comprise tubular conduits 36, 38. However, the conduits need not be tubular and in some instances other configurations are preferred. For example, referring to FIG. 1A, collector 58 comprises rectangular inner conduit 59. The rectangular configuration may be desirable when the theoretical focus varies excessively with seasons and the time of day in a single lens system as shown in FIG. 1. Providing a rectangular shape will allow movement of focus 48 while still maintaining it at conduit 59. Focus 48 has been shown on the surface of conduit 49, and in such a case, the surface of conduit 49 need not be solar energy transmitting and is preferably darkened. Fluid 56 inside conduit 59, as in FIG. 1, has a higher boiling point than outer fluid 54 since the concentration of the solar energy will be at the conduit containing fluid 56.

It is to be understood that the systems shown in the remaining figures and described hereinafter are longitudinally oriented in an east-west direction and faced towards the sun preferably by plus or minus 15° (plus in winter, minus in summer) of the latitude of the location in order to achieve an optimum concentration of solar energy, seasonally or for shorter periods of time. It is to be further understood that the elongated lenses or lens system and the elongated collectors and conduits thereof are arranged substantially along parallel longitudinal axes. Description will be made hereinafter of movable lens systems for tracking the sun; manual and automatic means for effecting tracking movement of systems and/or lenses on a seasonal basis are known. As mentioned hereinbefore, the refringent lenses according to the invention are operative to also concentrate diffuse solar energy which may represent up to about 40% of the solar energy at the system. While only part of a single lens is shown in FIG. 1, it is to be understood that many lenses may be longitudinally and radially juxtaposed to form systems which will be more fully described hereinafter. Use of many lenses results in a system with a high degree of solar energy concentration which is achieved quite economically.

Referring now to FIG. 2, solar energy collecting system 60 is shown comprising two transversely juxtaposed elongated fluid lenses 22 positioned about a radial axis of elongated collector 62. System 60 is similar to system 20 and will not, therefore, be described in detail. The system 60 is oriented generally as described hereinbefore and the lenses and collector are positioned to place the theoretical linear focus 64 of at least one of the lenses at and along the collector 62 for substantially all of the sun's daily and seasonal locations. Lenses 22 are supported by frame members 30 and support members 52. In the embodiment shown in FIG. 2, focus 64 is located within conduit 36 which is solar energy transmitting. Thus, higher boiling point fluid 56 is contained in conduit 36 and lower boiling temperature fluid 54 is contained in conduit 38 which may include an opaque heat conducting upper surface. The interior of lenses 22 may be communicated at the sides and or ends thereof (not shown) and means (not shown) may be provided for adding and removing fluid 31 and/or air.

In FIG. 3 is shown solar energy collecting system 70 including a system of three transversely juxtaposed lenses 22 positioned about a radial axis of collector 72 in which the linear focus of the lenses is located on the surface of conduit 36. Thus, the embodiment shown in FIG. 3 is similar to that of FIG. 2 except that three lenses are employed and the focus is on the surface of conduit 36. While FIGS. 2 and 3 show two and three lenses, respectively, it is to be understood that these are chosen for purposes of illustration and systems according to the invention may comprise more than three lenses. Conduits 36 and 38 may both include opaque heat conducting surfaces and the surface of outer conduit 36 is preferably darkened along the focus to enhance heat absorption form the solar energy therealong.

The systems shown in FIGS. 2 and 3, of course, have the ability to provide greater concentrations to the respective collectors than the system of FIG. 1 because of the increased lens surface area and also to provide a greater concentration for a longer portion of the daylight hours because of the arrangement of the lenses along radial axes of the collector.

In the embodiments shown in FIGS. 1–3, heating is accomplished by heat exchange between fluids 54 and 56 without the necessity of an external heat exchanger which reduces heat losses. Side panels 50 which are made of an insulating material further reduce heat losses. Additionally, plate 46 provides a greenhouse effect in the collectors to further reduce heat losses. Collector 24 is also preferably made of insulating material. The reduction in heat loss is especially important during periods of no or reduced sunshine. It is preferred that the theoretical focus of the lenses be located at the inner fluid (FIG. 1) to further reduces heat losses since the outer fluid will act as an insulator. The solar energy transmitting tubes in FIGS. 1–3 are preferably made of colorless and transparent glass or plastic and the tubes which need not transmit solar energy therethrough are preferably metal, preferably steel, copper or aluminum, and preferably have darkened outer surfaces.

According to the invention, the area of the collector surfaces may be much smaller than the area of the concentrators and may be only from about 2% to about 10% of the area of the concentrators, thus reducing the heat losses accordingly. As less material is required in the collector, the cost will be reduced.

As will be more apparent hereinafter, the collector systems may comprise a number of conduits other than two and configurations other than tubular, and the lenses and lens systems may be other than those shown in FIGS. 1-3 and may be movable and also track the sun.

Referring now to FIGS. 4–10, the fluid lenses according to the invention may have configurations other than those shown in FIGS. 1-3. In FIG. 4 is shown planar-convex lens 22 comprising curvilinear upper plate 26 and spaced planar lower plate 28 enclosing solar energy transmitting fluid 31. The plates may be economically made of glass or plastic and are joined at sides 32, 34 in a fluid-tight manner as by welding. Alternatively, lens 26 may be extruded with sides 32, 34 integrally joined. The ends of the lenses may similarly be welded or extruded. FIG. 5 shows a bi-convex lens 78 comprising spaced curvilinear plates 26. Lens 78 is formed as described for lens 22. Lens 80 shown in FIG. 6 comprises curvilinear upper plate 82, spaced planar lower plate 84 and side walls 86. Lens 80 is economically formed from a bulb of glass or plastic as by blowing as, for example, in the manufacture of glass or plastic bottles. The lenses shown in FIGS. 4–6 when used in collector systems are supported by suitable frames and structural members. For example, lens 80 is supported by frame 88 shown in FIGS. 7 and 8. As there shown, a plurality of lenses 80 are longitudinally juxtaposed at ends 90 and supported by longitudinal support stringers 92 and transverse support stringers 94. The lenses may be secured to the frame by, for example, adhesives. As shown in FIGS. 7 and 8, the theoretical focus 96 of the lenses is at and along collector 98. Means in the form of openings 100 are provided to add and remove fluid 31 and/or air and the openings may be communicated by, for example, tubes 102 to provide for circulation of the fluid. The openings may be provided in other locations, for example, as shown in FIGS. 4–7 and referenced by 100. As mentioned hereinbefore, the plates forming the lenses may be integrally extruded or blown or may comprise separate plates joined as by welding. Referring now to FIGS. 9 and 10, upper curvilinear plate 26 and lower planar plate 28 are separate pieces and are joined in a fluid-tight manner by means of frame 104. Frame 104 comprises two longitudinal grooves 106, 108. The upper groove 106 is curvilinear and sized to accommodate upper curvilinear plate 26 while the lower groove is linear and sized to accommodate planar plate 28. The edges of the respective separate plates are inserted into the respective grooves along with sealing material 110. The ends of the plates are similarly joined. The material 110 may comprise a gasket or similar flexible piece and/or deformable material such as silicone to form fluid-tight joints. Thus, the lenses according to the invention in which two independent plates are joined or the lenses are extruded or blown, are relatively easy to manufacture and are relatively inexpensive.

As mentioned hereinbefore, lens 22 may be movable to track the seasonal movement of the sun. In FIG. 11, system 112 is shown in which the side walls 114, 116 are made of expandable plastic whereby the system remains enclosed as described hereinbefore upon movement of lens 22 along a radial axis of the collector. With lens 22 in the positions designated by solid lines, walls 114, 116 assume first positions connected between respective bottom-sides of collector 118 and sides 32, 34 of the lens. Upon counter-clockwise rotation of the lens to the position designated by the broken lines, the lengths of the walls are changed and the system remains enclosed. Thus, a simple, inexpensive, enclosed system is provided in which the lens may be moved to track the seasonal location of the sun. Still referring to FIG. 11, collector 118 is shown comprising a single tubular inner conduit in which the focus 120 is located.

Description of preferred embodiments of the invention has been made hereinbefore with reference to linear theoretical focus fluid lenses. However, in accordance with the invention, the solar energy may be concentrated by focal point lenses and by solid lenses. In FIG. 12 is shown a plane refringent element 126 comprising a rigid frame 128 surrounding a sheet or plate of plastic or glass material 130 in which are formed by impressions or molding concentric closely spaced rings of microprisms 132 whose pitch, for example, corresponds to about 3 to about 6 microprisms per millimeter. The plane refringent element 126 acts like a plane Fresnel lens. Solar energy striking the refringent element 126 is concentrated by the microprisms into a theoretical point focus (not shown). Refringent elements 126 may be positioned longitudianlly juxtaposed as the fluid lenses in FIG. 7 and/or radially juxtaposed as the fluids lenses in FIGS. 2–3. The system may be arranged so that the point foci of lenses 126 are located within or at the surface of conduits 36, 38, 59 as described hereinbefore, the series of discrete point foci along a length forming, in effect, a linear focus composed of discrete point foci.

System 130 of FIG. 13 is shown employing an elongated refringent element 132 having longitudinal microprisms 134 acting as a longitudinal Fresnel lens. The lens 132 and collector 136 are arranged so that the linear focus is located at collector 136 which is similar to collector 24 in FIG. 1 except that two inner conduits 138, 140 are enclosed in outer conduit 36. Linear focus 142 is located within conduit 36. Providing three conduits permits use of three different fluids and allows for use of the fluids at varying temperatures for many different applications. FIG. 1A shows another arrangement for three conduits in which the inner conduit 139 is enclosed by intermediate conduit 141 which in turn is enclosed by outer conduit 36.

System 144 in FIG. 14 shows a rectilinear refringent element 146 formed with longitudinal microprisms 148 which direct the solar energy to different linear foci F, $F_1$, $F_2$ located at collector 150 depending upon the seasonal location of the sun. Collector 150 is located east-west so it is oriented to collect solar energy during daily movement of the sun, and comprises a single solar energy transmitting, at least at upper part 152, rectangular fluid conduit 154 which is surrounded in part by insulating material 42. Parts of system 144 are not shown to proportion. In particular, collector 150 is shown in larger proportion for clarity and is less than about 10% of the size of lens 146. A closed system is achieved by extending the sides of refringent element 146 and insulating material 42 into overlapping engagement. As described hereinbefore, use of a rectangular conduit 154 facilitates location of a moving focus such as F, $F_1$, $F_2$ within the conduit. Although element 146 focuses primarily by refracting the rays of the sun, the microprisms also provide reflection of rays such as 156. The inside sides of element 146 may also be suitably angled and made reflective to reflect any rays impinging thereon to the focus.

The present invention may be utilized for many energy applications as described hereinbefore and may also be advantageously used to distill or otherwise treat water by evaporation and condensation thereof. Typically, the water is seawater or brackish water and is to be desalinated, or water containing minerals or other substances such as industrial waste water or polluted water which is to be purified and distilled. Further in accordance with the invention, the refringent concentrators and collectors according to the invention are arranged in systems operative to distill water, preferably recovering the heat of condensation as described hereinafter. Preferred embodiments of such systems are shown in FIGS. 15–27.

The system 160 shown in FIG. 15 comprises a plurality of sub-systems 162, each employing a two lens arrangement 164 as shown in FIG. 2. Each lens pair 164 is supported in a manner similar to that described for FIG. 2 above an elongated, central, rectangularly configured channel 166 and parallel, elongated, rectangularly configured, side channels 168 such that the central part of the pair of lenses is above the central channels and the outer longitudinal edges of the lenses are above the side channels. Each individual lens is inclined and additionally the pair of lenses is rotated slightly in a clockwise direction such that adjacent pairs are overlapping. The bottom lens plates 28 are planar. The water 170 to be distilled is filled in the central channel to a predetermined height. Within channel 166 is positioned collector 172 which comprises conduits 36, 38 as in FIGS. 1-3. The focus 64 of the lens pair 164 is located within inner conduit 38. Preferably, the interior of lenses 22 is communicated with collector 172. In the embodiment shown in FIG. 15, lens fluid 31 is advantageously water and the interior of the lenses is communicated by conduit 174 with outer conduit 36 in which the fluid is also water. The fluid in the inner conduit 38 is a higher boiling point fluid as described hereinbefore. In operation, the water 170 to be distilled is heated by collector 172 due to the solar energy concentrated thereat and the water 170 is vaporized. The vapor strikes the lower plates 28, is condensed thereon and flows therealong to be discharged at or dropped from the edges thereof into side channel 168. In accordance with the invention, the water in the fluid lenses is circulated through collector 172. In this way, the heat released by condensation of the vapor is transmitted through the plate 28 to the water in the lenses and the heat absorbed by the water in the lens from the condensing vapor is returned to the system through conduit 36. This is significant because the latent heat required to vaporize the water 170 of about 539 calories per liter (975 BTU per kilogram) in addition to the sensible heat is substantially returned to the system by the circulated water in the lenses upon which the vapor condenses. This latent heat is substantial and would otherwise be lost. This results in a much higher efficiency of the system compared with solar stills where channels filled with water to be treated are covered with only glass plates which receive the solar rays. Circulating the water in the lenses also cools the lower lens plates 28 thereby assisting condensation thereon. Conduits 175 and 176 are provided for filling and emptying the respective channels. The water 170 to be distilled may be held between predetermined heights by a float system comprising float 178 and relays 180 and 182. Movement of the float activates respective relays to start and stop a pump or motor valve (not shown). A similar arrangement may be used in side channels 168 or a gravitational drain arrangement may be employed to maintain the height of distilled water in the side channels between predetermined heights. The respective channels are communicated to provide approximately equal levels in each of the respective channels. Advantageously, the channels are made of concrete or asbestos cement. Means other than the lens itself may be used to condense the vapor such as substantially smooth preferably planar plates located below the lenses 164. In such a case, the lens fluid may not recover the latent heat unless the plate is proximate thereto. Alternatively, means associated with the plate may be used to recover the latent heat.

The system shown in FIG. 15 is substantially enclosed by the channel panels to reduce heat loss as described hereinbefore. The two-conduit collector 172 is particularly advantageous since the fluid in the inner conduit 38 may be raised to a high temperature and used to store heat as described hereinbefore. This adds a very important capability to the system in that it can operate during the night and during periods of reduced sunshine. This is very important in that it provides the advantage of substantially continuous operation resulting in increased system output at reduced cost. The recovery of the latent heat of the condensing vapor by the lens fluid assists in providing a continuous operation system since heat loses are reduced. The water distillation systems described hereinafter operate in similar manner and description thereof will therefore be more limited.

In FIG. 16 is shown another embodiment (system 186) for treating water 170 employing a three lens arrangement (and a correspondingly larger area of evaporation) such as the one shown in FIG. 3 and a collector comprising single conduit 188. Lenses 22 are supported generally as described for FIG. 15 above central channels 190 and side channels 192 shown to be semicylindrical. System 186 operates similar to the system shown in FIG. 15. However, in FIG. 16 only a single conduit and fluid are used as the heating medium. Advantageously, the central channels are made of concrete and the side channels of asbestos cement.

In FIG. 17, a single lens system, single conduit system 196 is shown which is similar to those described hereinbefore. The adjacent channels 198, 200 for the water 170 to be distilled and the distilled water, respectively, are trough-shaped and may advantageously be formed from adjacent plates. The inclined lens 22 is above channels 198, 200 and the lower part of lens 202 terminates above channel 200 to permit the condensed water to fall therein.

Figure 18:
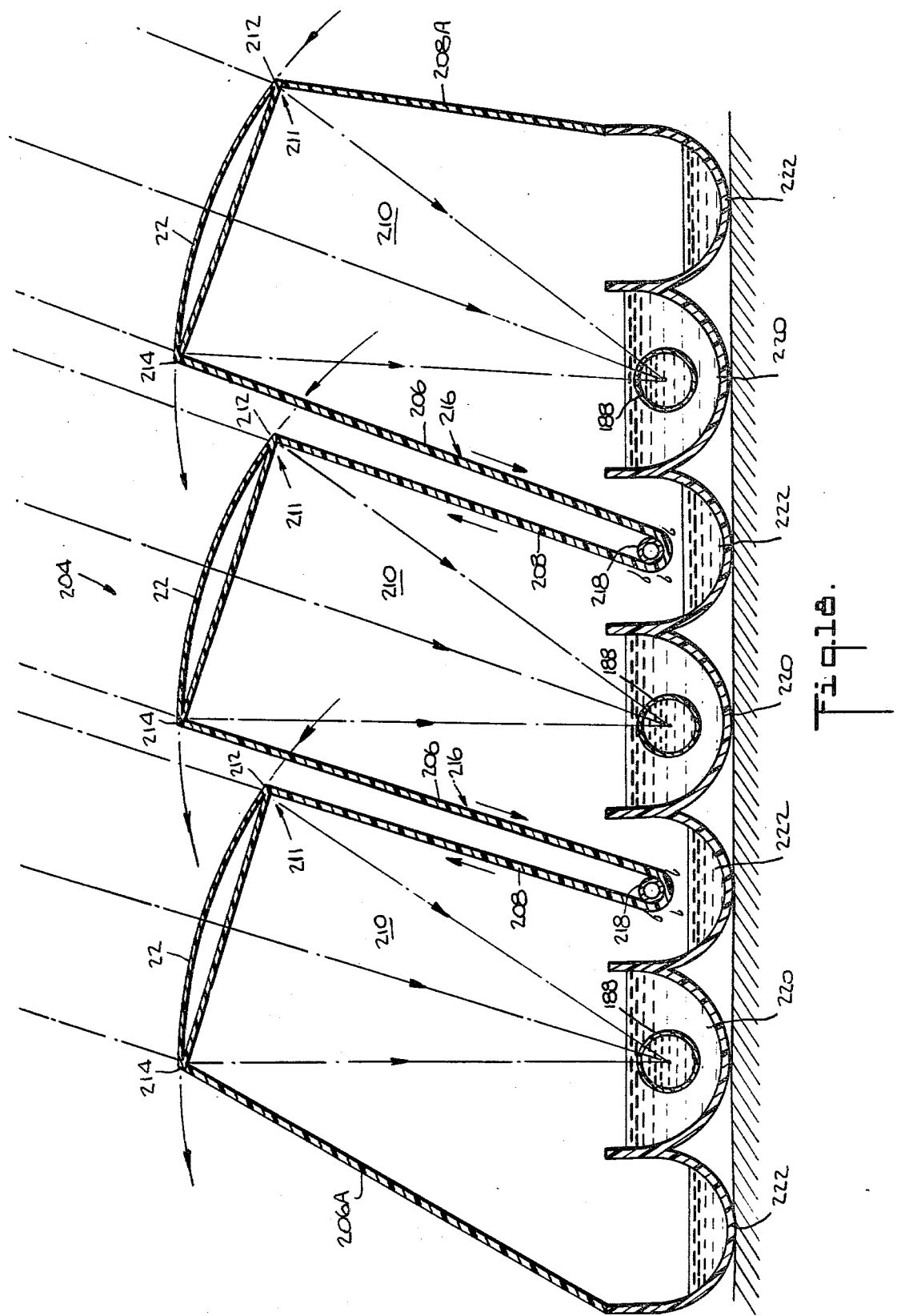
FIG. 18 is a schematic cross-section diagram of a composite system according to the invention for distilling water comprising individual systems, each comprising a single, elongated, movable fluid lens to follow the seasonal location of the sun and a collector comprising a single fluid-carrying conduit in which the individual systems are enclosed.

In FIGS. 18-21 are shown systems of the single lens, single conduit type described hereinbefore which are maintained essentially enclosed while lenses 22 are moved to track the sun. In FIG. 18, an expandable material, as described for FIG. 11, forms the side panels 206, 208 of each compartment 210 of the system. Advantageously, the material is of plastic. Opposed ends 212, 214 of adjacent side walls 208, 206 are secured to respective sides of lenses 22. Adjacent interior side walls are of one piece and are advantageously formed as a single sheet 216. Sheet 216 is wound partially about the circumference of tubular members 218 which extend along longitudinal axes parallel to those of the channels 220, 222. The tubular members are secured by means (not shown) to maintain sheets 216 as side walls 208, 206 as shown. The lower sides 210 of lenses 22 terminate above channels 222. The evaporation and condensation of the water proceeds as described hereinbefore. In addition to enclosing the system, condensed water flows down side panel 208; and side panels 206, 208, when cooled by the outside environment, will provide additional condensation of vapor which will flow down panel 206 as well. The system remains enclosed upon movement of the lens as follows. If the lenses are rotated counterclockwise, interior side panels 206 move downwardly and interior side panels 208 move upwardly about tubular members 218. The exterior side panels 206a and 208a are secured to the sides of respective channels 222 and are made of an expandable material as described in FIG. 11.

In FIGS. 19 and 20, another system 223 is shown for treating water in which the lens 22 is movable and the system maintained enclosed. A central elongated trough 224 holding water 170 to be treated is placed above elongated semi-cylindrical member 226 along parallel longitudinal axes. Member 226 is formed from sheet material 228 which is secured at opposite ends thereof 230, 232 to respective sides 32, 34 of lens 22. Sheet 228 extends from one end 230 thereof at lens side 32 downwardly between longitudinal tubular members 234 to form side wall 236, then downwardly below trough 224 and upwardly between longitudinal tubular members 238 to form channel 226, then upwardly to terminate at end 232 at lens side 34 and form side wall 240. Thus, system 226 is enclosed by a single sheet member. The tubular members permit the sheet to slide therebetween and maintain the width of channel 226. When lens 22 is rotated clockwise, side wall 240 moves downwardly and side wall 236 upwardly. Point 242 moves downwardly to become the bottom of the channel as referenced by 244 while the point previously at the bottom moves upwardly to be at point 244a.

In FIG. 21 is shown still another system 246 which is maintained enclosed upon movement of the lens. In system 246, the side panels 248, 250 are secured at opposed ends to lens sides 32, 34 and to opposed sides 252, 254 of central trough 256. The side panels 248, 250 are passed between tubular members 234, 236 in a manner similar to that shown in FIG. 21 to form outer channels 258 one of which is below lower sides 32 of lens 22. Movement of the lenses 22 in a counterclockwise direction causes side wall 250 to move upwardly reducing the size of channel 258 and side panel 248 to move downwardly increasing the size of channel 256.

Figure 22:
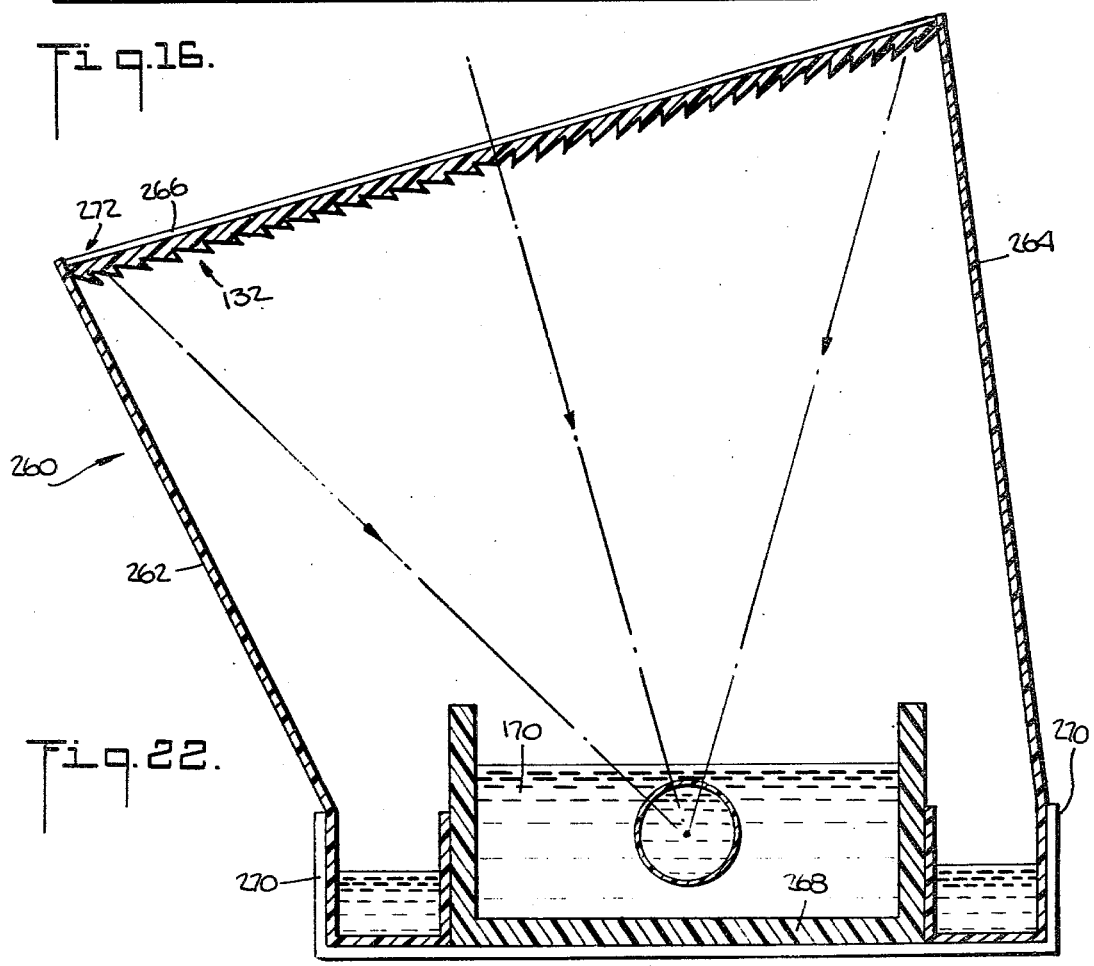
FIG. 22 is a transverse cross-section view of still another system according to the invention for distilling water comprising a single, movable, elongated, planar Fresnel-type lens having a linear focus and a collector comprising a single fluidcarrying conduit.

In FIG. 22 is shown a single lens, single conduit system 260 employing an elongated, planar Fresnel-type lens 132 in which the side walls 262, 264 are made of expandable material. Lens 132 is supported by solar energy transmitting glass or plastic support 266 and inclined with the central part of the lens above elongated central channel 268 containing the water 170 to be distilled and with lower part 272 above elongated side channel 270. Vaporization and condensation proceed similar to that described for FIG. 18. System 260 is maintained enclosed upon movement of lens 132 by stretching and shrinking of side panel 262, 266 as described for FIG. 11, opposed ends of the side walls being secured to respective sides of the lens and to respective parts of channels 270.

Referring now to FIG. 23, a portable water distillation system 280 is shown comprising elongated fluid lens 282 and single conduit collector 284. The system is easily assembled and disassembled. Lens 282 is made of flexible solar energy transmitting material such as clear plastic and forms an enclosure 286 when inflated by a fluid, advantageously water, which is introduced and removed and/or circulated by means including inlet 288 and outlet 290. Air is also removed and introduced through said means. Lens 280 is supported by frame 292 of metal or other suitable material which comprises upper frame members 294 and side support members 296. The upper ends 297 of the side support members 296 are pivotably connected to the upper frame members 294 as by bolts 298 such that each of the side support members is pivotable about the bolts in the directions indicated by the arrows. Means such as indentations 300 are provided in platform 302 to secure the lower ends 304 of the side members in selected positions. Alternatively, a platform is not used and ends 304 may be secured in the ground or otherwise. Pivoting of side members 296 adjusts angle A at which lens 282 is included for reasons which were described hereinbefore with respect to FIG. 1. An elongated vessel 306 advantageously collapsible and made of lightweight plastic is hung from frame members 294 below the central part of elongated lens 282 by cables or rope 308. Hinges 310 are provided to secure the cables to the vessel. Vessel 306 contains the water 170 to be distilled and conduit 312 is disposed within the water. A collecting vessel 314 is located below vessel 306 and below the lower inclined end 316 of lens 288. Vessel 314 advantageously collapsible and made of lightweight plastic is also hung from upper frame members by cables or ropes 308 and hinges 310. Vessel 314 is inclined preferably along the longitudinal direction to assist in draining treated water therefrom by means such as valve 317 in outlet 318. Port 320 is provided in vessel 306 for filling and emptying. Conduit 312 is advantageously collapsible and made of lightweight plastic and is solar energy transmitting, the theoretical linear focus of lens 282 beng located within conduit 312. Distillation of water 170 by heating of the fluid in conduit 312, advantageously water, and evaporation of the water, condensation of the vapor on the lens and collecting of the condensate proceed as described hereinbefore. Expandable side panels 320 may be provided to enclose the system and allow for movement of lens 282 as described hereinbefore and may be used to form collecting bags as shown in FIGS. 19–22. Means are provided to indicate the water levels in the vessels 306, 314 such as vertical transparent glass or plastic tubes 322, 324 located outside side panels 320 and connected by tubing with the bottoms of the vessels.

In FIG. 24 is shown another embodiment of a portable water distillation system 330 which is easily assembled and disassembled. System 330 comprises planar Fresnel lenses 126 of the type shown in FIG. 12 having concentric microprisms causing the solar energy to be concentrated at point foci. Lenses 126 are longitudinally and transversely juxtaposed to form a composite lens assembly of six Fresnel lenses which is inclined with respect to the horizontal, six being chosen for purposes of illustration. The lenses are formed into an assembly by, for example, securing them as by adhesives to a solar energy transmitting glass or plastic plate 332 which, in the case of plastic, may be folded along flexible partition lines 334. Each Fresnel lens may be about 9 inches by about 7 inches and are presently available at a cost of about $0.40 each. The point foci of the lenses are located in the water to be distilled in flexible container or bag 336 made of plastic or other plyable material. Flexible container or bag 338 made of plastic or other flexible material located below and extending beyond container 336 is used to collect condensate from plate 332. The lens assembly and containers are supported by support assembly 340 comprising pairs of legs 342, 344, frame 346 and platform 348. The legs are pivotably connected to frame 346 as described for FIG. 23 to adjust the angle of incline of the lens assembly to follow the seasonal location of the sun. The containers or bags have side panels 350, 352 which extend upwards to plates 332 to form an enclosed system as described hereinbefore. An opening is provided in side panel 352 at the lower side of plate 332 to allow the condensate to drop into the collector bar 338. Means such as transparent tubes 322, 324 connected to the bottom of the containers are used to indicate water levels therein as described for FIG. 23. The lens assembly, support assembly and containers are easily assembled and disassembled. The foci located in the water to be distilled in container 336 heat the water and cause it to evaporate, condensing on the bottom of planar plates 332. The condensate moves along plates 332 and falls into container 338. Depending upon location, production of distilled water will be about 1 pound per hour for a system as shown in FIG. 24 having a lens surface area of 10 square feet (about 1 square meter). This production of distilled water is without recovering the latent heat of condensation. Production of distilled water could be about six times larger if the latent heat of condensation is recovered. As mentioned hereinbefore, portable systems can be used at sea or in desert areas.

Still another portable distillation system 356 is shown in FIG. 25. Lens assembly 358 comprises longitudinally juxtaposed, linear focus, fluid lenses 360 mounted in frame 362. Lenses 360 and lens frame 362 are similar to those described with respect to FIGS. 6-8, the lenses being blown and filled with liquid. The lens assembly is supported by pairs of legs 364, 366 which are pivotably connected to frame 358 to change the angle of inclination of the lens assembly to follow the seasonal location of the sun. Container 368 for the water to be distilled and container 370 for the condensate are supported by frame 360 by cables or rope 308.

Referring now to FIGS. 26 and 27, another distillation system 370 is shown. Lens assembly 372 is supported on frame 374 which in turn is pivotably supported by U-shaped support member 376. Threaded studs 378 extend from the frame through the support member and threaded knobs or nuts 380 lock the lens assembly in position. Member 376 is secured in base 382. Containers 384, 386 are supported from frame 374 by cables or ropes 308. Side panels 388 are provided to enclose the system and are movable with respect to rollers 390. Water to be distilled is added to container 384 by tube 392 and distilled water is removed from container 386 by spigot 394. The angle of incline of lens assembly 372 is changed to follow the seasonal location of the sun by loosening threaded knobs or nuts 380 to unlock the lens assembly, rotating the lens assembly to a new position, and tightening the knobs to lock the lens assembly. Pivoting of the lens does not move the containers. However, rollers 390 permit movement of the lens assembly with respect to the side panels 388 so that the system remains enclosed. The lens assembly and containers are manually rotatable about base 382 as a unit to further follow the location of the sun as follows. A threaded shaft 396 is rigidly secured to the lower part of the assembly, and base 382 comprises a threaded portion to accept the threaded shaft. This threaded arrangement between the base and the shaft with the support member connected thereto permit rotation of the shaft and support member about the base. If desired, non-manual means such as motors can be used to rotate the system and/or to pivot the lens assembly.

According to another aspect of the invention, the concentrated solar energy is used to generate electricity by means of photoelectric cells. More particularly, the luminous rays of the sun are concentrated on photovoltaic cells. Referring to FIG. 28, photovoltaic cells 398 made of silicon or cadmium or other materials are disposed in the interior of inner fluid-carrying conduit 400 shown advantageously to be of rectangular cross-section. The theoretical focus 402 of the lens is at the cells and preferably on the outer surface thereof. The cells may be juxtaposed if the theoretical focus 402 is linear or spaced if the theoretical focus 402 is a point focus. The concentrated luminous rays are converted to electricity by the cells while the heat absorbed by the cells from the infrared rays is removed by the circulating fluid 404 and also by the fluid 406 circulating within the outer conduit 408. The removal of heat can be controlled by the size of the conduits 402, 406 and by the volume and rate at which the fluid are ciculated. Preferably fluid 404 is substantially electrically non-conductive such as air or other gases and liquids. Means (not shown) are provided for connecting the cells in parallel or series and for removing the generated electricity. If fluid 404 is electrically conducting, means (not shown) are provided for electrically insulating the cells and the means for interconnecting the cells and for removing the generated elecricity. Conduit 402 has at least its upper surface made of transparent material if the theoretical focus 402 is linear or transparent apertures may be provided above the cells if the theoretical focus 402 is at a point. The upper part of outer conduit 408 is also transparent. The details of inner and outer conduits have been described hereinbefore.

As mentioned hereinbefore, in accordance with the invention, concentrating the luminous energy of the sun with the concentration of up to about 100 permits electricity to be generated at up to about 100 times more power while the increased heat energy is dissipated and removed by the fluids in the conduits. Electricity may be generated in conjunction with other uses of solar energy. For example, referring to FIGS. 1-3, using a dual fluid carrying collector, photoelectric cells may be inserted therein as just described and electricity generated while the heat energy is being used to heat a structure.

An arrangement for using a point focus lens is shown in FIG. 29. The theoretical focus is at opening 410 in fluid-carrying conduit 412 which is made of solar energy transmitting material. If desired, a photoelectric cell may be located in opening 410. An insulating material 414 surrounds conduit 412 except at openings 410. A point focus fluid lens is referenced by 416.

CONCLUSION

Prominent aspects and advantages of the invention may be summarized as follows:

A lens concentration system is combined with a conduit collector system in which the surface area of the concentrating system exposed to the sun is from about 10 to about 100 times larger than the surface area of the collecting system through which the energy is concentrated. As a result heat losses are reduced substantially since the collector has an area of, for example, only from about 1% to about 10% of conventional flat plate collector systems and the overall surface area is about half that of conventional flat plate systems. Thus, the efficiency over conventional flat plate systems is in the order of about 50% higher. This reduction in surface area reduces correspondingly the material requirements per unit of surface area exposed to the sun and the investment cost is also reduced correspondingly to about one-half.

More solar energy can be collected by the method and apparatus according to the invention since the collector conduits are oriented east-west thereby being located at the foci of the lenses throughout the day and, according to the invention, the lenses can be moved and positioned at various inclinations to optimally follow the seasonable location of the sun. This positioning of the lens can represent up to 40% higher solar energy collection. Even using auxiliary equipment to adjust the inclination of the lenses, the rotation in investment is in the order of a third over flat panel systems. Not only is the investment cost much less than known solar systems, but the operating cost of obtaining heat energy is lower. Also the cost of heat derived from solar energy according to the invention is lower and may be up to one-third lower than the cost of petroleum fuels based on the usable heat content. This is of great importance to oil importing countries. Additionally, solar energy is inexhaustable and does not produce pollution as does the burning of other fuels.

According to the invention, by concentrating the solar energy at elongated conduits, higher temperatures, for example, exceeding 200° C. (392° F.) are attainable using high boiling temperature fluids in the conduits such as lubricating oil, glycerine, etc. This is to be compared with to about 80° C. (176° F.) attainable by flat plate systems. According to the invention, multiple conduits, either conduit receiving the foci of the lenses, allows storing solar heat to be used for hours without sunshine. The invention provides for storage of heated fluids in the inner conduit of high temperature, for example, over 200° C. which heats the outside fluid to lower temperatures, for example, 80° C. Using this arrangement permits a reduction in storage volume required by the higher temperature fluid over fluids at about 80° C. According to the invention, low boiling point and low latent heat of vaporization fluids such as freon, ether, etc. are used in the conduits which fluids are vaporized and superheated by the solar energy and used to produce electricity in expansion motors such as turbines at lower cost than using fuel.

Electricity may also be produced according to the invention with photovoltaic cells where the increased solar energy concentration of up to 100 times increases substantially the electric production and correspondingly reduces the cost of electricity. Several circulating fluids in several conduits are employed to remove the heat developed by the concentrated infrared solar rays.

Employing several fluids according to the invention permits simultaneous use for many purposes such as heating water, heating buildings, air conditioning, producing electricity, etc.

An advantage of the present invention over reflecting systems is that diffuse sun energy of up to about 40% can be collected. Reflecting systems generally require costly tracking equipment to follow the location of the sun and such reflective systems are more expensive for this and other reasons including maintenance of the reflective surfaces.

Further according to the invention water containing salt or other substances is distilled using solar energy collection and concentration according to the invention and recovering a large part of the latent heat of vaporization and sensible heat (about 1100 BTU/lb or 600 cal/kg). This is accomplished by using the fluid circulating in the lens system to recover the latent heat and circulating the fluid in the conduit in the water to be distilled thereby heating the water to be distilled. The salt from the concentrated brine may also be recovered and sold or electrolyzed. Distillation according to the invention is at low cost such that water may be produced for irrigation purposes. The invention provides for portable dismountable distillation units which could be used to distill sea water in lift boats or brackish water in arid desert areas thereby possibly saving lives.

While specific applications of the invention have been described, many are uses of the collected solar energy are possible. For example, the salt by-product of desalination may be collected and sold to reduce the over-all operating cost of the system. Additionally, the salt may be separated into sodium and chlorine by electrolysis by electricity generated by the solar energy collecting system. In this respect, water can be separated into hydrogen and oxygen also by electrolysis, the hydrogen of which in turn may be used in the manufacture of liquid methanol which is easily transported and may be used as fuel for automobiles, airplanes, etc. The system described hereinbefore could be combined with known heat pumps to further utilize the collected solar energy in combination with the heat provided by the heat pumps, particularly for refrigeration systems. In addition to providing energy for heating, the systems according to the invention could be used for air conditioning and, as just mentioned, in refrigeration systems. Also, the multi-conduit collectors and fluids are capable of providing temperatures of about 70° C. to about 80° C. for heating rooms and and for heating water, and at higher temperatures, for example, about 180° C. to about 200° C., for heat storage applications and to produce electricity.

The apparatus according to the invention has been described primarily using schematic diagrams. Accordingly, certain details not essential to an understanding of the invention have been omitted. For example, the materials and support structure comprising the apparatus according to the invention not described in detail will be known to those skilled in the respective arts. The sizes of the parts of the apparatus described hereinbefore will vary depending on the use to which the apparatus is put. For example, the lenses in FIG. 3 may each be 60 inches wide for a total radial width of 180 inches for three lenses. The conduit in a single conduit collector may be a tube 2 inches in diameter wherein the concentration of the lenses on the tube is in the order of 90. In a two conduit collector system, where the inner fluid is lubricating oil heated to about 200° C., the space required to store an equal amount of heat will be about 2½ times less than for a fluid such as water heated to 80° C. Also, the multiple conduit system permits multiple uses for the heats of the different fluids. For example, a fluid heated to about 200° C. may be used to heat buildings and a fluid heated to about 70° C. to 80° C. may be used for heating water. As shown in FIGS. 2, 3, 7, 8, 15, 16, 18, many fluid lens may be radially and longitudinally juxtaposed to form composite systems from individual systems or very large systems. The Fresnel-type lenses may have similar length and width dimensions and may be similarly employed in composite or large systems. Portable distillation units may be used, for example, as mentioned hereinbefore, in lifeboats to distill sea water or in desert areas to distill brackish water and thereby possibly save lives. Portable units according to the invention could produce, for example, one pound of distilled water for every square meter (about 10 square feet) of lens concentrator area exposed to the sun's rays, and this without recapturing the heat of condensation. The production of distilled water, however, will be about six times as great if the heat of condensation is recovered.

It is pointed out that the heat obtained from the sun using the energy systems according to the invention may be lower in cost than heat energy obtained from fuels which may thus be replaced. Heat storage provided by systems according to the invention is a feature which also makes these systems competitive with fuels. The distillation systems according to the invention are capable of providing distilled water at low cost and therefore are important where clean water is scarce.

The advantages of the present invention, as well as certain changes and modifications of the disclosed emoodiments thereof, will be readily apparent to those skilled in the art. It is the applicant's intention to cover by their claims all those changes and modifications which could be made to the embodiments of the invention herein chosen for the purposes of the disclosure without departing from the spirit and scope of the invention.

What is claimed is:

1. Apparatus for converting solar energy to electrical energy cmprising elongated collector means including an inner elongated conduit adapted to pass a fluid therethrough and an outer elongated conduit adapted to pass a fluid therethrough enclosing said inner conduit, said outer and inner conduits having substantially parallel axes and said outer and inner conduits being transparent at least in part with the transparent parts of said outer and inner conduits being in alignment, said apparatus further comprising elongated lens means having an axis extending substantially parallel to said axes of said outer and inner conduits and having an elongated focus in which the solar energy may be concentrated, said lens means and said outer and inner conduits being positioned so that the elongated focus of said lens means is adapted to extend substantially within and substantially along the length of said inner conduit, and photoelectric means disposed in said inner conduit in a heat exchanging relationship with the fluid adapted to be passed through said inner conduit, said photoelectric means being in alignment with the transparent parts of said outer and inner conduits and being adapted to receive concentrated solar energy passing through the transparent parts of said outer and inner conduits.

2. The apparatus of claim 1, wherein said photoelectric means comprise photovoltaic cells.

3. The apparatus of claim 2, wherein said lens means is operative to concentrate solar energy in substantially discrete points along said length of said inner conduit and said photovoltaic cells are spaced apart along said length in said inner conduit, said lens means and said photovoltaic cells being arranged and adapted so that respective photovoltaic cells receive the solar energy concentrated in the discrete points.

4. The apparatus of claim 2, wherein said lens means is operative to concentrate solar energy along said length in said inner conduit at a concentration factor of up to about 100.

5. The apparatus of claim 1, wherein said lens means comprises an elongated fluid lens having an axis parallel to the axes of said inner and outer conduits.

6. The apparatus of claim 1 and comprising the fluid which is adapted to be passed through each of said inner and outer conduits.

7. The apparatus of claim 6, where the fluid in each of said inner and outer conduits is different.

8. An elongated collector for converting solar energy to electrical energy comprising an inner elongated conduit adapted to pass a fluid therethrough and an outer elongated conduit adapted to pass a fluid therethrough enclosing said inner conduit, said outer and inner conduits having substantially parallel axes and said outer and inner conduits being transparent at least in part with the transparent parts of said outer and inner conduits being in alignment, and photoelectric means disposed in said inner conduit in a heat exchanging relationship with the fluid adapted to be passed through said inner conduit, said photoelectric means being in alignment with the transparent parts of said outer and inner conduits and being adapted to receive concentrated solar energy passing through the transparent parts of said outer and inner conduits.

9. The apparatus of claim 8, wherein said photoelectric means comprise photovoltaic cells.

10. The collector of claim 8, wherein said photovoltaic cells are spaced in said inner conduit along said length thereof and adapted to receive solar energy concentrated in a plurality of spaced point foci along said length.

11. The apparatus of claim 8 and comprising the fluid which is adapted to be passed through each of said inner and outer conduits.

12. The apparatus of claim 11, wherein the fluid in each of said inner and outer conduits is different.

13. Apparatus for converting solar energy to electrical energy comprising elongated collector means including an inner elongated conduit adapted to pass a fluid therethrough and an outer elongated conduit adapted to pass a fluid therethrough enclosing said inner conduit, said outer and inner conduits having substantially parallel axes and said outer conduit being transparent at least in part, said apparatus further comprising elongated lens means having an axis extending substantially parallel to said axes of said outer and inner conduits and having an elongated focus in which the solar energy may be concentrated, said lens means and said outer and inner conduits being positioned so that the elongated focus of said lens means is adapted to extend substantially on or within and substantially along the length of said inner conduit, and photoelectric means disposed in or on said inner conduit in a heat exchanging relationship with the fluid adapted to be passed through said inner conduit, said photoelectric means being in alignment with the transparent part of said outer conduit and being adapted to receive concentrated solar energy passing through the transparent part of said outer conduit.

14. An elongated collector for converting solar energy to electrical energy comprising an inner elongated conduit adapted to pass a fluid therethrough and an outer elongated conduit adapted to pass a fluid therethrough enclosing said inner conduit, said outer and inner conduits having substantially parallel axes, said outer conduit being transparent at least in part, and photoelectric means disposed in or on said inner conduit in a heat exchanging relationship with the fluid adapted to be passed through said inner conduit, said photoelectric means being in alignment with the transparent part of said outer conduit and being adapted to receive concentrated solar energy passing through the transparent part of said outer conduit.

* * * * *

UNITED STATES PATENT AND TRADEMARK OFFICE
CERTIFICATE OF CORRECTION

PATENT NO. : 4,191,594

DATED : March 4, 1980

INVENTOR(S) : Stark, et al.

It is certified that error appears in the above—identified patent and that said Letters Patent is hereby corrected as shown below:

Column 2, line 3, change "Fresneltype" to --Fresnel type--.

Column 5, line 22, after "system" insert --similar--, line 40, change "fluidtight" to --fluid-tight--.

Column 6, line 43, change "fluidcarrying" to --fluid-carrying--.

Column 8, line 48, change "sotrage" to --storage--.

Column 10, line 32, change "reduces" to --reduce--.

Column 11, line 66, change "longitudianlly" to --longitudinally--.

UNITED STATES PATENT AND TRADEMARK OFFICE
CERTIFICATE OF CORRECTION

PATENT NO. : 4,191,594          Page 2 of 3

DATED : March 4, 1980

INVENTOR(S) : Stark, et al.

It is certified that error appears in the above—identified patent and that said Letters Patent is hereby corrected as shown below:

Column 12, line 16, change "1A" to --13A--.

Column 14, line 44, change ".." to --.--.

Column 16, line 53, change "bar" to --bag--.

Column 17, line 64, change "ciulated" to --circulated--.

Column 18, line 4, change "elecricity" to --electricity--;

line 49, change "to" to --by--;

line 60, change "rotation" to --reduction--.

Column 19, line 13, change "of" to --at--;

line 56, change "lift" to --life--.

Column 20, line 65, change "emoodiments" to --embodiments--.

UNITED STATES PATENT AND TRADEMARK OFFICE
CERTIFICATE OF CORRECTION

PATENT NO. : 4,191,594

DATED : March 4, 1980

INVENTOR(S) : Stark, et al.

It is certified that error appears in the above—identified patent and that said Letters Patent is hereby corrected as shown below:

Column 21, line 39, change "2" to --3--.

Column 22, line 11, change "8" to --9--.

Signed and Sealed this

*Twenty-fourth* Day of *November 1981*

[SEAL]

*Attest:*

GERALD J. MOSSINGHOFF

*Attesting Officer*     *Commissioner of Patents and Trademarks*